(12) United States Patent
Han et al.

(10) Patent No.: US 8,941,173 B2
(45) Date of Patent: Jan. 27, 2015

(54) CAPACITORLESS MEMORY DEVICE

(71) Applicant: Samsung Electronics Co., Ltd., Suwon-si (KR)

(72) Inventors: Seung-Uk Han, Suwon-si (KR); Jae-Hoon Lee, Daejeon (KR); Jun-Su Kim, Anyang-si (KR); Satoru Yamada, Seoul (KR); Jin-Seong Lee, Gapyeong-gun (KR); Nam-Ho Jeon, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 15 days.

(21) Appl. No.: 13/775,586

(22) Filed: Feb. 25, 2013

(65) Prior Publication Data

US 2013/0248980 A1 Sep. 26, 2013

(51) Int. Cl.
| | |
|---|---|
| *H01L 29/66* | (2006.01) |
| *H01L 27/088* | (2006.01) |
| *H01L 27/11* | (2006.01) |
| *H01L 27/108* | (2006.01) |

(52) U.S. Cl.
CPC .............. *H01L 27/088* (2013.01); *H01L 27/11* (2013.01); *H01L 27/108* (2013.01)
USPC ......................................... 257/329; 438/212

(58) Field of Classification Search
CPC ..................................................... H01L 27/088
USPC ....................................................... 257/329
See application file for complete search history.

(56) References Cited

U.S. PATENT DOCUMENTS

| | | | |
|---|---|---|---|
| 5,977,589 A | 11/1999 | Schloesser et al. | |
| 6,075,265 A | 6/2000 | Goebel et al. | |
| 6,501,110 B1 | 12/2002 | Mukai et al. | |
| 6,501,116 B2 | 12/2002 | Kisu et al. | |
| 6,560,142 B1 | 5/2003 | Ando | |
| 6,970,372 B1 | 11/2005 | Furukawa et al. | |
| 7,919,800 B2 | 4/2011 | Gonzalez et al. | |
| 2007/0189057 A1* | 8/2007 | Cheng et al. | 365/149 |
| 2011/0069564 A1 | 3/2011 | Taketani | |
| 2011/0193159 A1* | 8/2011 | Kujirai | 257/331 |
| 2012/0161229 A1* | 6/2012 | Kwon et al. | 257/331 |

FOREIGN PATENT DOCUMENTS

JP         2002198499 A        7/2002

* cited by examiner

*Primary Examiner* — Ajay K Arora
(74) *Attorney, Agent, or Firm* — Harness, Dickey & Pierce, PLC

(57) ABSTRACT

According to an example embodiment of inventive concepts, a capacitorless memory device includes a capacitorless memory cell that includes a bit line on a substrate; a read transistor, and a write transistor. The read transistor may include first to third impurity layers stacked in a vertical direction on the bit line. The first and third layers may be a first conductive type, and the second impurity layer may be a second conductive type that differs from the first conductive type. The write transistor may include a source layer, a body layer, and a drain layer stacked in the vertical direction on the substrate, and a gate line that is adjacent to a side surface of the body layer. The gate line may be spaced apart from the side surface of the body layer. The source layer may be adjacent to a side surface of the second impurity layer.

20 Claims, 26 Drawing Sheets

CAPACITORLESS MEMORY DEVICE

CROSS-REFERENCE TO RELATED APPLICATIONS

This application claims priority under 35 U.S.C. §119 to Korean Patent Application No. 10-2012-0029414, filed on Mar. 22, 2012, in the Korean Intellectual Property Office, the disclosure of which is incorporated herein in its entirety by reference.

BACKGROUND

1. Field

Some example embodiments of inventive concepts relate to a capacitorless memory device, and/or a capacitorless memory device in which one capacitorless memory cell has two transistors.

2. Description of the Related Art

Electronic apparatuses are continuously becoming smaller and lighter according to the rapid growth of the electronics field and user demand. Accordingly, a semiconductor device, one of the core parts of the electronic apparatus, may be highly integrated. As a result, a memory device may be highly integrated and have a relatively large capacity.

Of memory devices, a dynamic random access memory (DRAM) includes a capacitor. For DRAM, reducing the capacity of the capacitor may affect the memory function.

SUMMARY

Some example embodiments of inventive concepts provide a capacitorless memory device in which one memory cell has two transistors for higher integration of a memory device.

According to an example embodiment of inventive concepts, a capacitorless memory device includes at least one capacitorless memory cell. Each capacitorless memory cell includes a bit line on a substrate, a read transistor, and a write transistor. The read transistor includes a first impurity layer, a second impurity layer, and a third impurity layer stacked in vertical direction on a bit line, where the first and third impurity layers are a first conductive type, and the second impurity layer is a second conductive type that is different from the first conductive type. The write transistor includes a source layer, a body layer, and a drain layer stacked in the vertical direction on the substrate, and a gate line adjacent to a side surface of the body layer of the read transistor. The source layer is adjacent to a side surface of the second impurity layer of the read transistor. The gate line is spaced apart from the side surface of the body layer. The source layer of the write transistor may be configured to function as a gate electrode of the read transistor.

The write transistor may further include a source barrier layer between the source layer and the body layer, and a drain barrier layer between the drain layer and the body layer.

The body layer may include a first body layer, a second body layer over the first body layer, and a shutter layer that is between the first and second body layers.

The source layer and the drain layer may include metal. The source layer and the body layer may form a first Schottky contact. The drain layer and the body layer may form a second Schottky contact.

An upper surface of the gate line may be as high as or higher than an upper surface of the body layer, and a lower surface of the gate line may be as high as or lower than a lower surface of the body layer.

The lower surface of the gate line and a lower surface of the source layer may be at equal heights.

A lower surface of the source layer may be as low as or lower than a lower surface of the second impurity layer.

An upper surface of the source layer may be higher than upper surfaces of the second impurity layer and the third impurity layer.

The gate line may surround the side surface of the body layer.

The gate line may surround the side surface of the drain layer.

The capacitorless memory device may further include a ground line that is electrically connected to the third impurity layer.

The capacitorless memory device may further include a fourth impurity layer electrically connected to the ground line, wherein the fourth impurity layers is the second conductive type, and the fourth impurity layer is adjacent to the second impurity layer.

The bit line may extend in a first direction. The gate line and the ground line may extend in a second direction that is different from the first direction.

According to another example embodiment of inventive concepts, a capacitorless memory device includes a bit line on a substrate, first and second capacitorless memory cells, and a gate line. Each of the first and second capacitorless memory cells include a read transistor and a write transistor. The read transistor includes a first impurity layer, a second impurity layer, and a third impurity layer stacked in a vertical direction on the bit line, where the first and third impurity layers are a first conductive type, and the second impurity layer is a second conductive type that is different from the first conductive type. The write transistor includes a source layer, a body layer, and a drain layer, which are stacked in the vertical direction on the substrate. The source layer is adjacent to a side surface of the second impurity layer of the read transistor. The gate line that is adjacent to a side surface of the body layer and spaced apart from the side surface of the body layer. The source layer of the write transistor may be configured to function as a gate electrode of the read transistor.

The second impurity layer of the first capacitorless memory cell and the second impurity layer of the second capacitorless memory cell may be integrally formed.

According to another example embodiment of inventive concepts, a capacitorless memory cell includes a bit line, a ground line, a data word line, and at least one capacitorless memory cell. The at least one capacitorless memory cell includes a read transistor on the bit line and a write transistor. The read transistor includes a source structure electrically connected to the bit line, a drain structure electrically connected to the ground line, and a body structure between the source and drain structures. The write transistor includes a vertical stack including a source layer, a body layer, and a drain layer, and a gate adjacent to the vertical stack. The drain layer is connected to the data word line. The source layer is configured to function as a gate electrode for the read transistor.

A first interwall insulation layer may be between the source layer of the write transistor and at least one of the source structure, body structure, and drain structure of the read transistor. The source structure, body structure, and drain structure of the read transistor may be sequentially stacked on a substrate. A ground line may be electrically connected to the body structure of the read transistor.

The body layer and the drain layer of the write transistor may be surrounded by the gate of the write transistor. The source structure and the drain structure of the read transistor may be a first conductive type. The body structure may be a second conductive type that is different than the first conductive type.

A first interwall insulation layer may be between the source layer of the write transistor and at least one of the source structure, body structure, and drain structure of the read transistor. The source structure, body structure, and drain structure of the read transistor are sequentially stacked on a substrate. The ground line may be arranged to it is not directly connected to the body structure of the read transistor.

A device isolation layer may be between the ground line and the bit line. The read transistor may be a vertical-type transistor structure. The source structure and the drain structure of the read transistor may be first conductive type. The body structure may be a second conductive type. The second conductive type may be different than the first conductive type.

BRIEF DESCRIPTION OF THE DRAWINGS

Example embodiments of inventive concepts will be more clearly understood from the following detailed description taken in conjunction with the accompanying drawings, in which like reference characters refer to the same parts through the different views. The drawings are not necessarily to scale, emphasis instead being placed upon illustrating principles of inventive concepts. In the drawings.

DETAILED DESCRIPTION OF THE EMBODIMENTS

Figure 1:
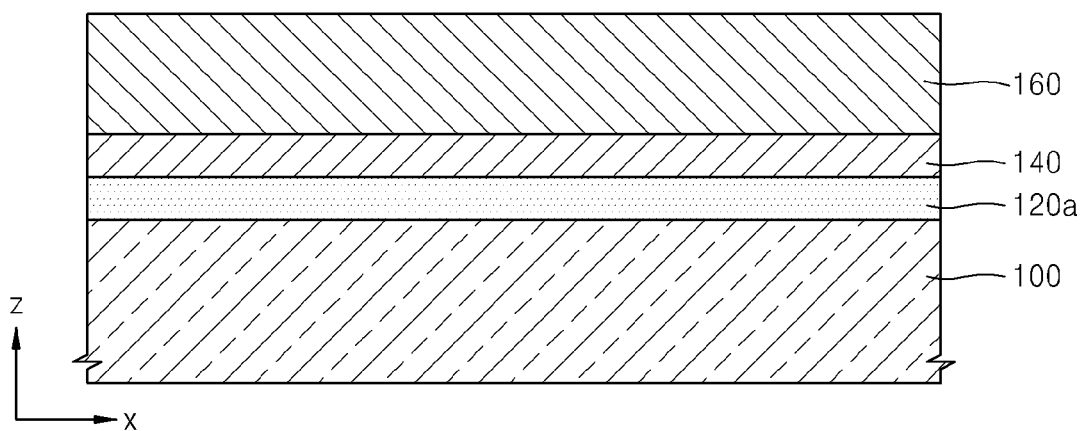
FIG. 1 is a cross-sectional view illustrating a process of forming a bit line layer, a first impurity layer, and a second impurity layer, according to an example embodiment of inventive concepts.

Reference will now be made in detail to some example embodiments of inventive concepts, examples of which are illustrated in the accompanying drawings. Example embodiments of inventive concepts, may, however, be embodied in many different forms and should not be construed as being limited to the embodiments set forth herein; rather, these example embodiments of inventive concepts are provided so that this disclosure will be thorough and complete, and will fully convey the scope of example embodiments of inventive concepts to those of ordinary skill in the art. In the drawings, the thicknesses of layers and regions are exaggerated for clarity. In the drawings, the thicknesses of layers and regions are exaggerated for clarity. Like reference numerals in the drawings denote like elements, and thus their description may be omitted.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Other expressions, such as, "between" and "directly between", describing the relationship between the constituent elements, may be construed in the same manner. Other words used to describe the relationship between elements or layers should be interpreted in a like fashion (e.g., "between" versus "directly between," "adjacent" versus "directly adjacent," "on" versus "directly on").

The terms such as "first" and "second" are used herein merely to describe a variety of constituent elements, but the constituent elements are not limited by the terms. The terms are used only for the purpose of distinguishing one constituent element from another constituent element. For example, without departing from the scope of example embodiments of inventive concepts, a first constituent element may be referred to as a second constituent element, and vice versa.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless defined otherwise, all terms used herein including technical or scientific terms have the same meanings as those generally understood by those skilled in the art to which example embodiments of inventive concepts may pertain. The terms as those defined in generally used dictionaries are construed to have meanings matching that in the context of related technology and, unless clearly defined otherwise, are not construed to be ideally or excessively formal.

As used herein, the term "and/or" includes any and all combinations of one or more of the associated listed items.

FIG. 1 is a cross-sectional view illustrating a process of forming a bit line layer 120a, a first impurity layer 140, and a second impurity layer 160, according to an example embodiment of inventive concepts. Referring to FIG. 1, the bit line layer 120a, the first impurity layer 140, and the second impurity layer 160 are sequentially formed in the stated order on a substrate 100. The bit line layer 120a, the first impurity layer 140, and the second impurity layer 160 may be sequentially stacked on the substrate 100.

The substrate 100 may be formed of, for example, a substrate including semiconductor materials such as a silicon (Si) substrate, a silicon-on-insulator (SOI) substrate, a gallium-arsenic (Ga—As) substrate, a silicon-germanium (Si—Ge) substrate, etc. or a ceramic substrate, a quartz substrate, or a glass substrate for display. An impurity injection area (not shown) such as a well, for example, may be formed in the substrate 100. An insulation layer (not shown) may be formed in the substrate 100 or in an upper portion of the substrate 100. When an insulation layer is formed in the upper portion of the substrate 100, the insulation layer may be used for electrical insulation between a plurality of bit lines to be described below and semiconductor materials forming the substrate 100.

The bit line layer 120a may be formed on the substrate 100. The bit line layer 120a may be formed of, for example, metal, that is, any one of the materials selected from a group consisting of Al, W, Cu, Ti, TiN, WN, Ta, TaN, and TiAlN, or a combination thereof.

The first and second impurity layers 140 and 160 may be formed of doped polysilicon. The first impurity layer 140 may be formed of doped polysilicon of a first conductive type, whereas the second impurity layer 160 may be formed of doped polysilicon of a second conductive type different from the first conductive type. The first and second impurity layers 140 and 160 may be, for example, n+ polysilicon and p polysilicon, respectively. In other words, the concentration of n-type impurity doped in the first impurity layer 140 may be greater than that of p-type impurity doped in the second impurity layer 160.

The first impurity layer 140 may be formed by injecting an impurity of a first conductive type after undoped polysilicon is formed. The second impurity layer 160 may be formed by injecting an impurity of a second conductive type after undoped polysilicon is formed.

Alternatively, after the doped polysilicon of a first conductive type is formed, the impurity of a second conductive type is injected into an upper portion of the doped polysilicon of a first conductive type so that a portion of the polysilicon remains as the first conductive type and a portion of the polysilicon that changed to the second conductive type may form the first and second impurity layers 140 and 160, respectively.

Figure 2:
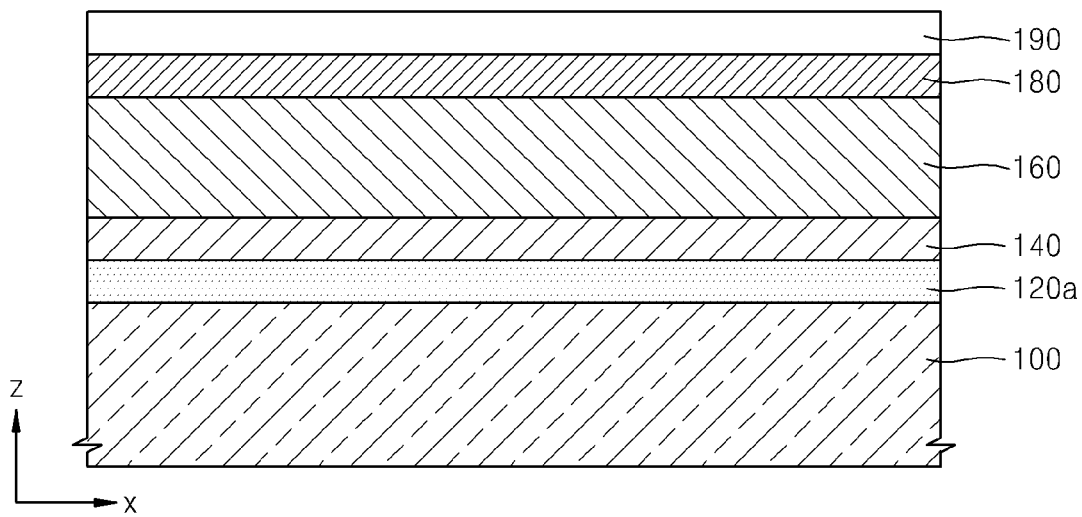
FIG. 2 is a cross-sectional view illustrating a process of forming a third impurity layer, according to an example embodiment of inventive concepts.
Figure 3:
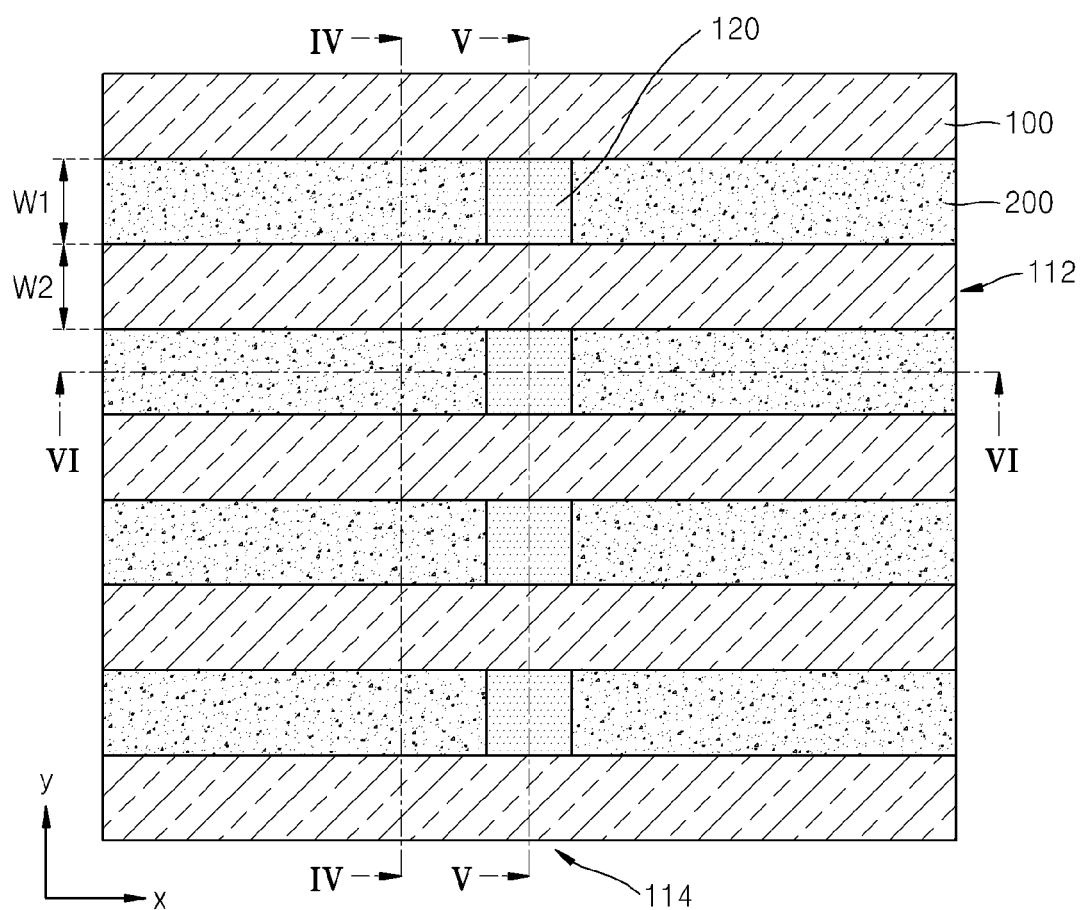
FIGS. 3 to 6 are a plan view and cross-sectional views illustrating a process of forming first and second trenches, according to an example embodiment of inventive concepts.

FIG. 2 is a cross-sectional view illustrating a process of forming a third impurity layer 180, according to an example embodiment of inventive concepts. Referring to FIG. 2, the third impurity layer 180 may be formed by forming a part of an upper portion of the second impurity layer 160 of the first conductive type. In other words, the third impurity layer 180 may be formed by injecting an impurity of the first conductive type in a part of the upper portion of the second impurity layer 160 of FIG. 1. In this case, the third impurity layer 180 may be formed by injecting an impurity of the first conductive type by an ion injection method. A buffer layer 190 may be formed on the second impurity layer 160 before the ion injection method is performed. Alternatively, the buffer layer 190 may be formed on the third impurity layer 180 after the third impurity layer 180 is formed.

Instead of using the ion injection method, the third impurity layer 180 may be formed by vapor depositing on the second impurity layer 160 a doped polysilicon layer of the first conductive type.

Figure 4:
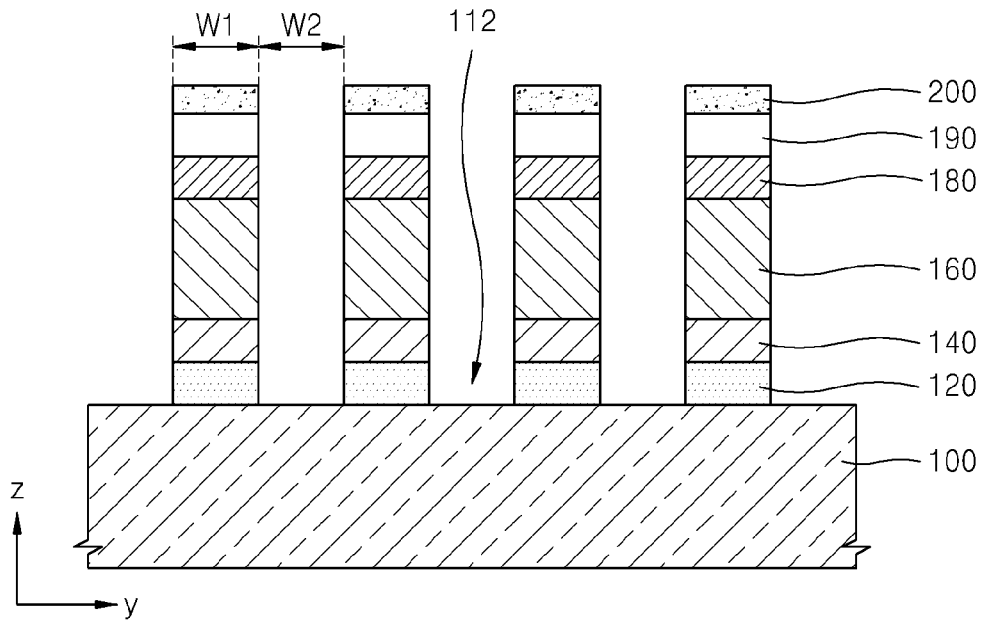
Figure 5:
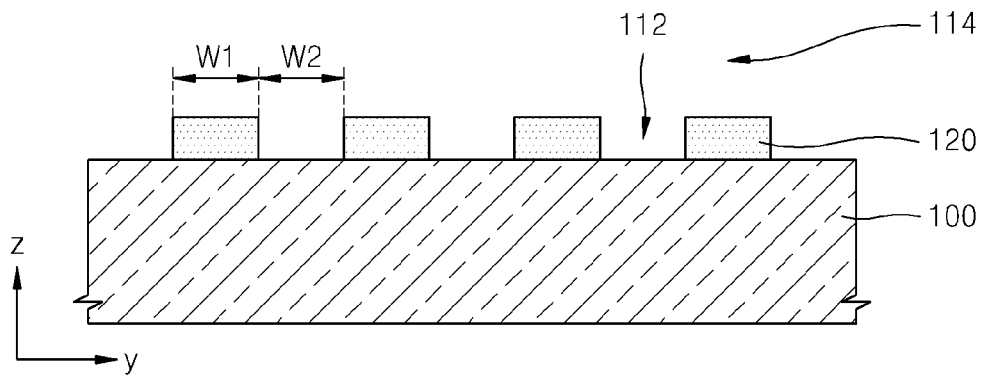
Figure 6:
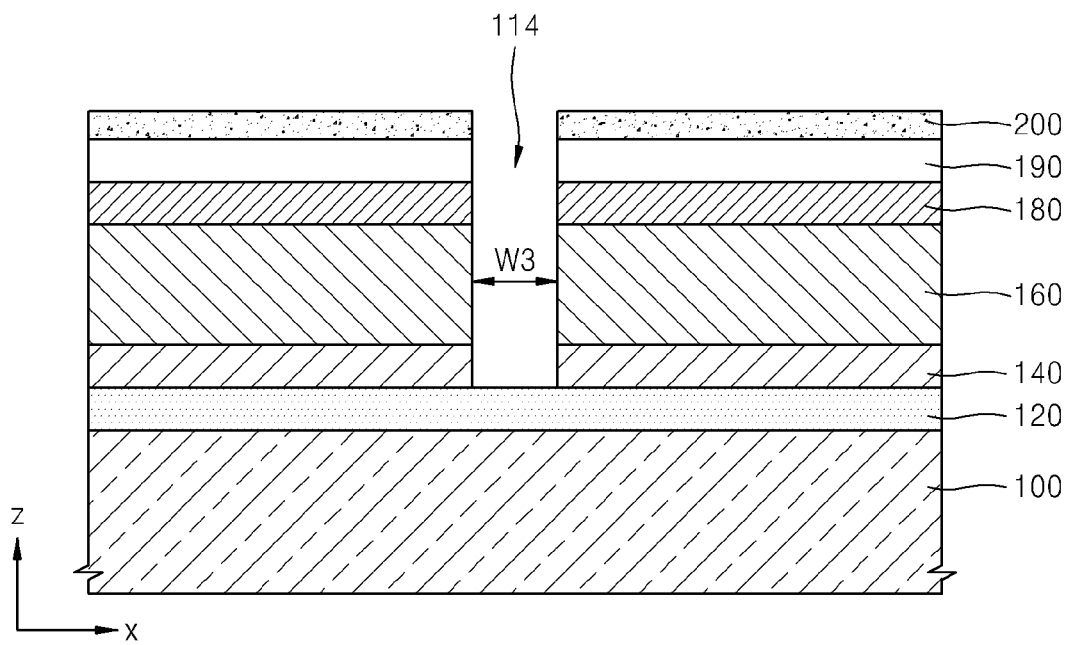

FIGS. 3 to 6 are a plan view and cross-sectional views illustrating a process of forming first and second trenches 112 and 114, according to an example embodiment of inventive concepts. In detail, FIGS. 4, 5, and 6 are cross-sectional views taken along lines IV-IV, V-V, and VI-VI of FIG. 3, respectively.

Referring to FIGS. 3 to 6, after a mask layer 200 is formed on the buffer layer 190, the first trench 112, which may expose the substrate 100, is formed by removing parts of the first to third impurity layers 140, 160, and 180, the buffer layer 190, the bit line layer 120a, and the mask layer 200, and the second trench 114 is formed by removing parts of the first to third impurity layers 140, 160, and 180, the buffer layer 190, and the mask layer 200. The mask layer 200 may be formed of, for example, a nitride. For example, the mask layer 200 may be formed of a silicon nitride.

The first trench 112 extends in a first direction x that is parallel to an upper surface of the substrate 100 so that the bit line layer 120a of FIGS. 1 and 2 may be divided into the bit lines 120. In other words, the bit lines 120 may extend in the first direction x. The second trench 114 is extends in a second direction y that is parallel to the upper surface of the substrate 100 and different from the first direction x so that the bit lines 120 may be exposed. The second trench 114 may cross the first trench 112. The substrate 100 may be exposed in a portion of the second trench 114 crossing the first trench 112. The first and second directions x and y may be, for example, perpendicular to each other.

The first and second trenches 112 and 114 may be formed by performing an etch process twice on a structure in which the bit lines 120, the first to third impurity layers 140, 160, and 180, the buffer layer 190, and the mask layer 200 are stacked. For example, after a mask pattern having a space extending in the second direction y is formed, an etch process is performed to expose the bit lines 120. Then, after a mask pattern having a space extending in the first direction x is formed, an etch process is performed to expose the substrate 100. Thus, the first and second trenches 112 and 114 may be formed.

The first trench 112 may be formed in a plural number and an interval between the first trenches 112 may be a first width W1. The first trench 112 may have a second width W2. The first width W1 and the second width W2 may have the same value. The first and second widths W1 and W2 each may be, for example, 1F. 1F signifies a minimum feature size.

As shown in FIG. 6, the second trench 114 may have a third width W3. The width W3 may be, for example, 1F. The second trench 114 may be formed such that one second trench 114 is arranged per multiples of the width of one capacitorless memory cell to be formed in the first direction x. For example, when the width in the first direction x of a capacitorless memory cell to be formed is 5F, the second trench 114 may be arranged for multiples of 5F. Also, when the width in the first direction x of a capacitorless memory cell to be formed is 4F, the second trench 114 may be arranged for multiples of 4F.

Figure 7:
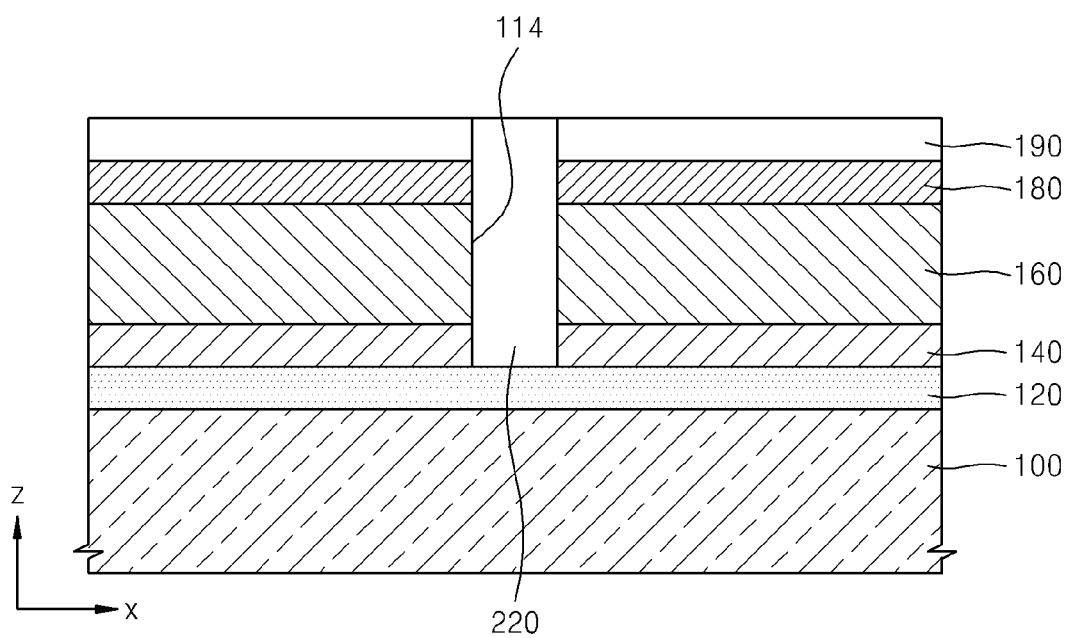
FIG. 7 is a cross-sectional view illustrating a process of forming a device isolation layer, according to an example embodiment of inventive concepts.

FIG. 7 is a cross-sectional view illustrating a process of forming a device isolation layer 220, according to an example embodiment of inventive concepts. Referring to FIG. 7 and FIGS. 3 to 6, the device isolation layer 220 may be formed to fill the first and second trenches 112 and 114. The device isolation layer 220 may be formed by depositing an insulation material covering the substrate 100 and filling the first and second trenches 112 and 114, performing chemical mechanical polishing (CMP) using the mask layer 200 as an etch stop layer (or alternatively performing an etch back process instead of CMP), and then removing the mask layer 200. The device isolation layer 220 may be formed of a silicon oxide, a silicon nitride, or a combination thereof.

Figure 8:
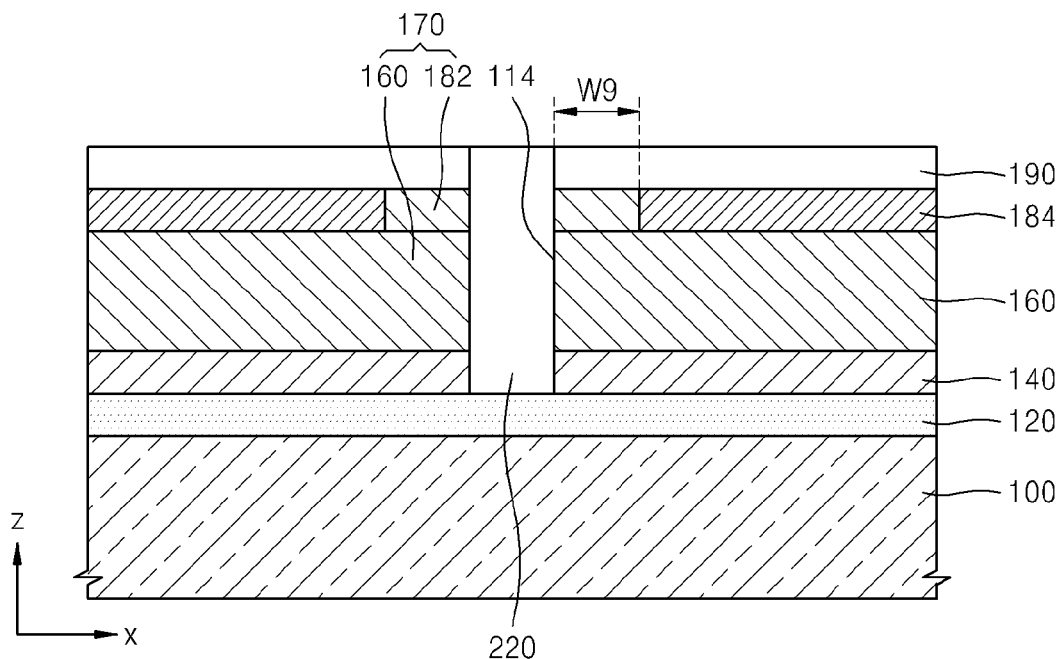
FIG. 8 is a cross-sectional view illustrating a process of forming a fourth impurity layer, according to an example embodiment of inventive concepts.

FIG. 8 is a cross-sectional view illustrating a process of forming a fourth impurity layer 182, according to an example embodiment of inventive concepts. Referring to FIGS. 7 and 8, the fourth impurity layer 182 is formed by injecting an impurity of a second conductive type into a part of the third impurity layer 180. The fourth impurity layer 182 may be formed in a portion of the third impurity layer 180 of FIG. 7 that is adjacent to the device isolation layer 220. The fourth impurity layer 182 may be formed, for example, in a portion of the third impurity layer 180 of FIG. 7 that is within 0.5F or 1F from the device isolation layer 220. Only a portion of the third impurity layer 180 of FIG. 7, except for a portion where the fourth impurity layer 182 is formed, may remain as a remained third impurity layer 184.

Since the second and fourth impurity layers 160 and 182 are both of a second conductive type, they may be treated as an extended second impurity layer 170 of a second conductive type. In other words, the extended second impurity layer 170 may include the second impurity layer 160 and the fourth impurity layer 182 extended from the second impurity layer 160. When carrier concentrations or impurity concentrations of the second and fourth impurity layers 160 and 182 are the same or similar to each other, the second and fourth impurity layers 160 and 182 may be considered as one body formed of the same continuous material according to an analysis method.

For example, the fourth impurity layer 182 may be formed by injecting an impurity of a second conductive type after a photoresist pattern (not shown) that exposes a portion of the buffer layer 190 disposed above a portion where the fourth impurity layer 182 is to be formed, or the portion of the buffer layer 190 disposed above a portion where the fourth impurity layer 182 is to be formed and the device isolation layer 220. The photoresist pattern may be, for example, a pattern extending in a direction in which the device isolation layer 220 extends and having a space having a width of 2F or 3F.

Figure 9:
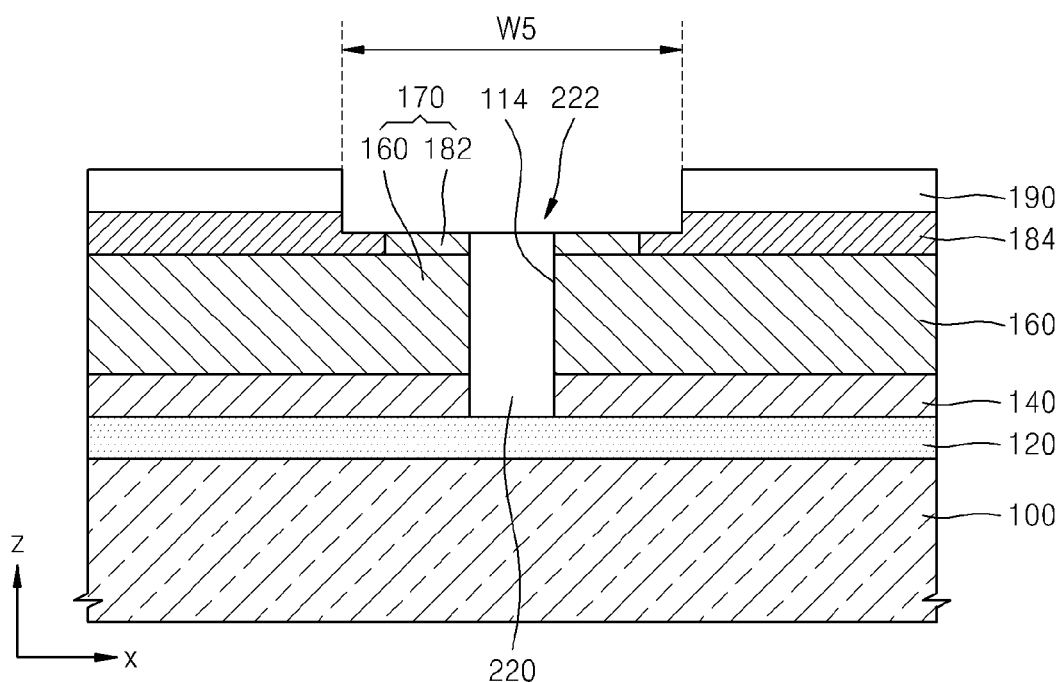
FIG. 9 is a cross-sectional view illustrating a process of forming a third trench, according to an example embodiment of inventive concepts.

FIG. 9 is a cross-sectional view illustrating a process of forming a third trench 222, according to an example embodiment of inventive concepts. Referring to FIG. 9, the third trench 222 is formed by removing parts of the buffer layer 190, the remained third impurity layer 184, the fourth impurity layer 182, and the device isolation layer 220. The third trench 222 may be formed by removing a part of an upper portion of the device isolation layer 220 and parts of upper portions of the third and fourth impurity layers 184 and 182, which are adjacent to the device isolation layer 220. The third trench 222 may have a fifth width W5. The fifth width W5 may be, for example, 3F or 4F, or 2F or 3F.

To inhibit (and/or prevent) the third trench 222 from penetrating the remained third impurity layer 184 and/or the fourth impurity layer 182, a lower surface of the third trench 222 may be between an upper surface and a lower surface of the remained third impurity layer 184 and/or the fourth impurity layer 182. The device isolation layer 220, the remained third impurity layer 184, and the fourth impurity layer 182 may be exposed from the lower surface of the third trench 222.

The third trench 222 may extend along the same direction of the second trench 114. The third trench 222 may extend along a direction, that is, the second direction y of FIG. 3, which is perpendicular to both the first direction x and a third direction z that is perpendicular to the first direction x.

Figure 10:
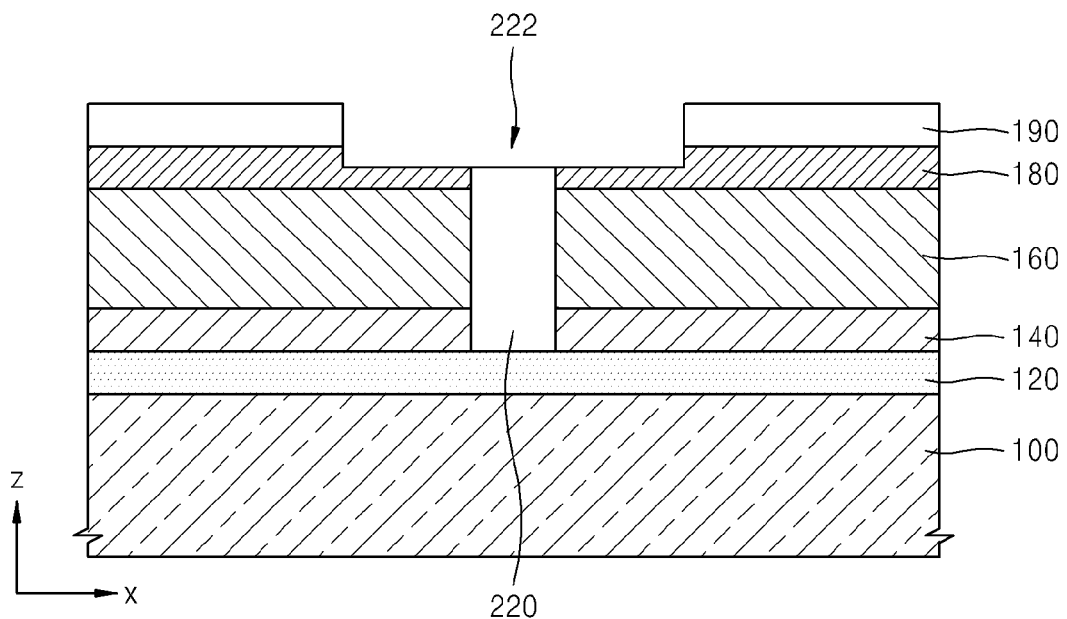
FIG. 10 is a cross-sectional view illustrating a process of forming the third trench, according to another example embodiment of inventive concepts.

FIG. 10 is a cross-sectional view illustrating a process of forming the third trench 222, according to another example embodiment of inventive concepts. In detail, FIG. 10 is a cross-sectional view illustrating a process of forming the third trench 222 after forming the device isolation layer 220 of FIG. 7. In more detail, FIG. 10 is a cross-sectional view illustrating a process of forming the third trench 222 without forming the fourth impurity layer 182 of FIG. 8 after forming the device isolation layer 220 of FIG. 7. The same description as that with reference to FIG. 9 may be omitted herein.

Referring to FIG. 10, the third trench 222 is formed by removing parts of the buffer layer 190, the third impurity layer 180, and the device isolation layer 220. The third trench 222 may be formed by removing parts of upper portions of the device isolation layer 220 the third impurity layer 180, which are adjacent to the device isolation layer 220. The third trench 222 may have a fifth width W5. The fifth width W5 may be, for example, 3F or 4F.

To inhibit (and/or prevent) the third trench 222 from penetrating the third impurity layer 180, a lower surface of the third trench 222 may be between an upper surface and a lower surface of the third impurity layer 180. The device isolation layer 220 and the third impurity layer 180 may be exposed from the lower surface of the third trench 222.

Figure 32:
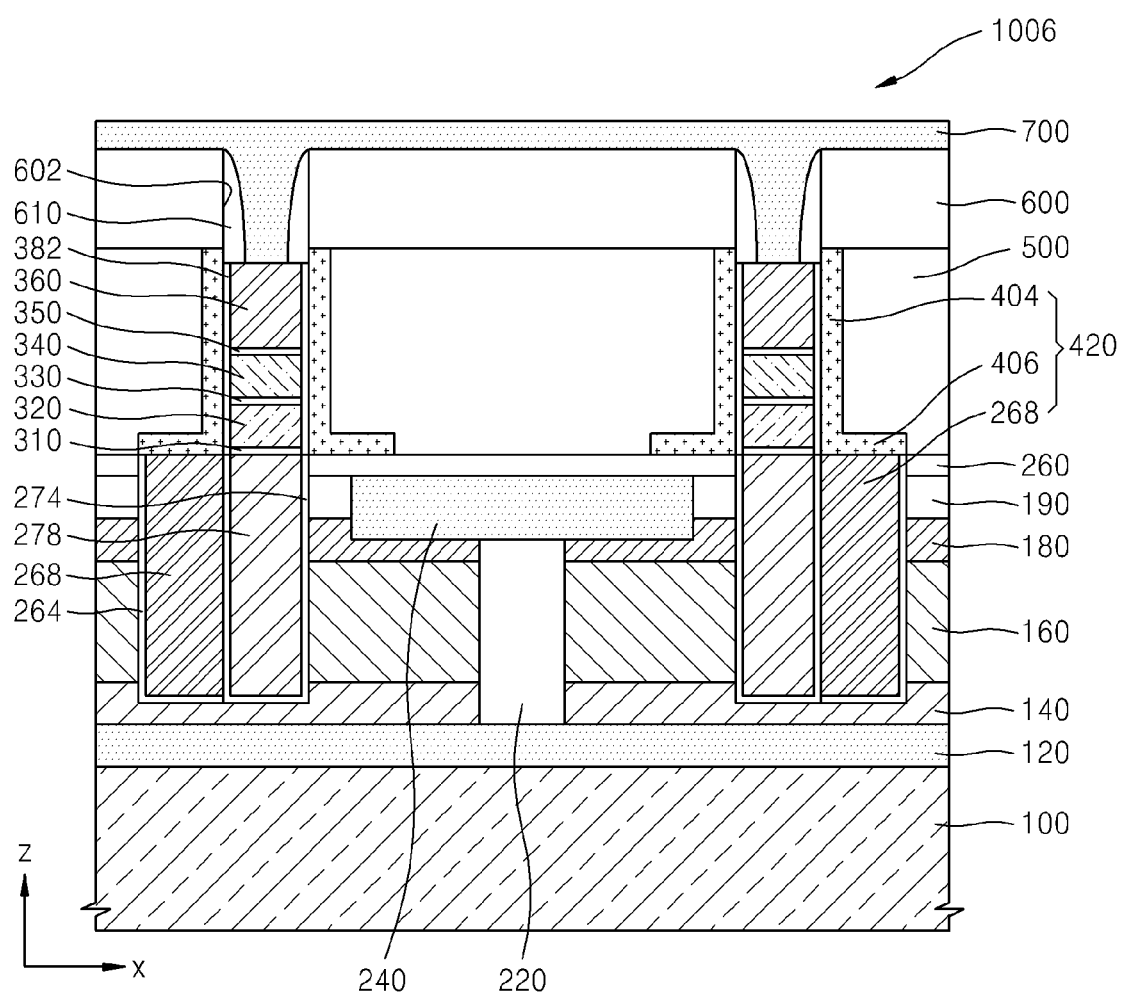

FIGS. 11 to 29 illustrate subsequent processes after forming the fourth impurity layer 182 and the third trench 222 illustrated in FIGS. 8 and 9, according to example embodiments of inventive concepts. The subsequent processes may be performed after the third trench 222 is formed as described with reference to FIG. 10, a result of which is illustrated in FIG. 32.

Figure 11:
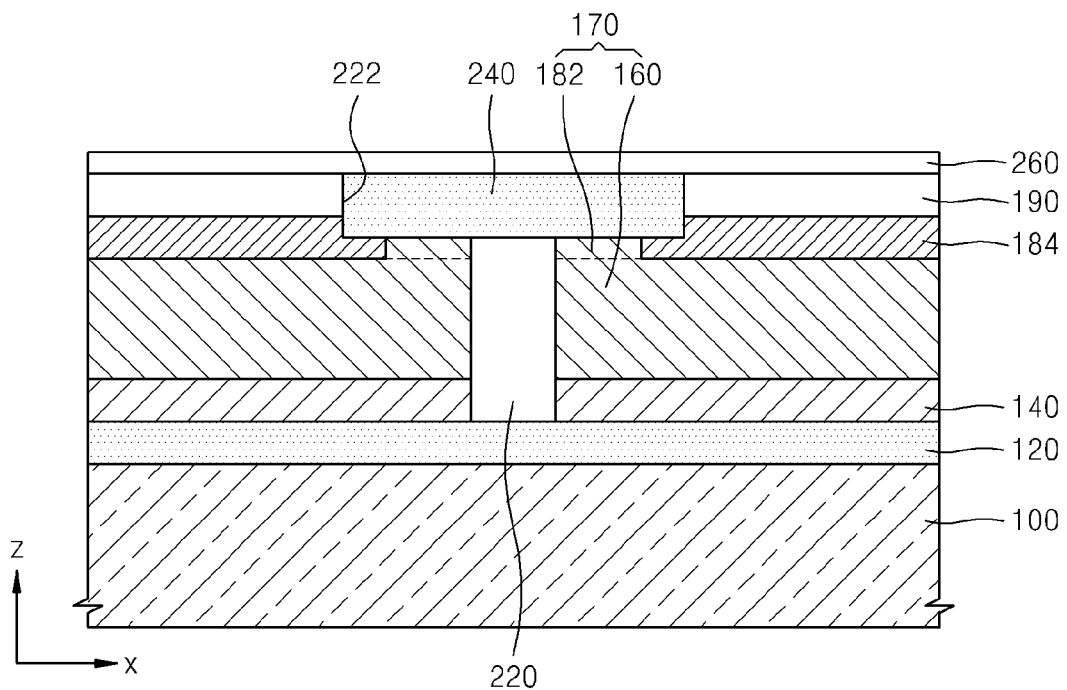
FIG. 11 is a cross-sectional view illustrating a process of forming a ground line, according to an example embodiment of inventive concepts.

FIG. 11 is a cross-sectional view illustrating a process of forming a ground line 240, according to an example embodiment of inventive concepts. Referring to FIG. 11, the ground line 240 may be formed to fill the third trench 222. The ground line 240 may be formed of, for example, metal, that is, any one of the materials selected from a group consisting of Al, W, Cu, Ti. TiN, WN, Ta, TaN, and TiAlN, or a combination thereof. The ground line 240 may be formed, for example, by forming a preliminary ground line material layer (not shown) filling the third trench 222 above the substrate 100 and then performing a planarization process to expose the buffer layer 190.

After the ground line 240 is formed, a first cover insulation layer 260 for covering the ground line 240 may be formed. The first cover insulation layer 260 may be formed completely covering the ground line 240 and the buffer layer 190. The first cover insulation layer 260 may be formed of, for example, an oxide, a nitride, or a combination thereof.

Since the ground line 240 contacts the extended second impurity layer 170 and the remained third impurity layer 184, the ground line 240 may be electrically connected to the extended second impurity layer 170 and the remained third impurity layer 184. The extended second impurity layer 170 may include the second impurity layer 160 and the fourth impurity layer 182, and the ground line 240 may be electrically connected to both of the remained third impurity layer 184 and the fourth impurity layer 182.

Figure 12:
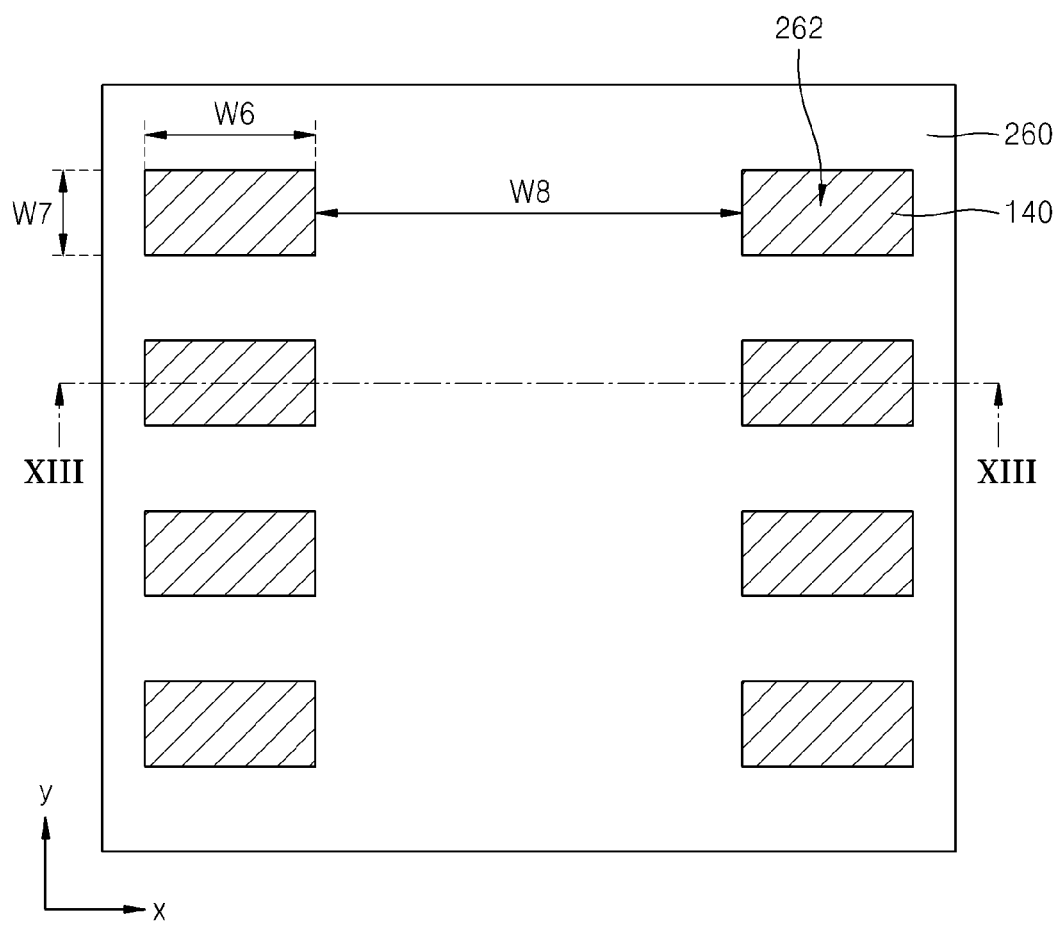
FIGS. 12 and 13 are respectively a plan view and a cross-sectional view illustrating a process of forming a first opening, according to an example embodiment of inventive concepts.
Figure 13:
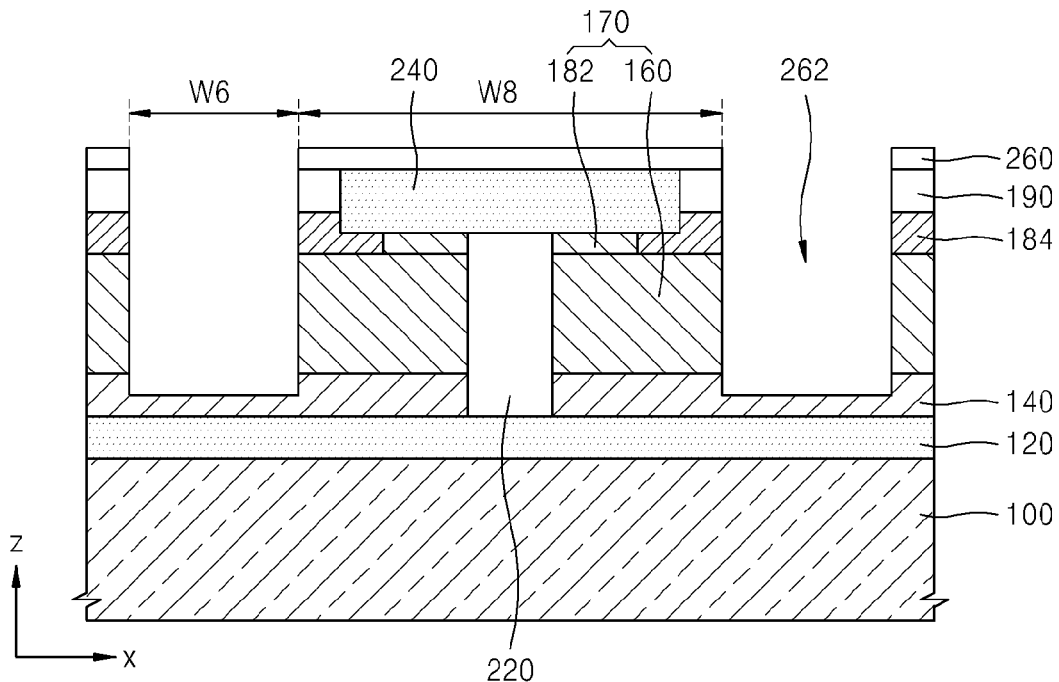

FIGS. 12 and 13 are respectively a plan view and a cross-sectional view illustrating a process of forming a first opening 262, according to an example embodiment of inventive concepts. In detail, FIG. 13 is a cross-sectional view taken along line XIII-XIII of FIG. 12.

Referring to FIGS. 12 and 13, the first opening 262 that penetrates the first cover insulation layer 260, the buffer layer 190, the remained third impurity layer 184, and the second impurity layer 160 is formed by removing parts of the first cover insulation layer 260, the buffer layer 190, the remained third impurity layer 184, and the second impurity layer 160. The first opening 262 may extend in part of the first impurity layer 140 by removing a part of the first impurity layer 140. The first impurity layer 140 may be exposed through the first opening 262.

The first opening 262 may be formed in a plural number in rows in the second direction y at both sides of the device isolation layer 220 or the ground line 240. The first opening 262 may be arranged on each of the bit lines 120. The first opening 262 may completely or partially overlap with each of the bit lines 120. The first opening 262 may have a sixth width W6 in the first direction x and a seventh width W7 in the second direction y. The sixth and seventh widths W6 and W7 may be, for example, 2F and 1F, respectively.

The first openings 262 may be separated from each other at an interval of an eighth width W8 on both sides of the device isolation layer 220 or the ground line 240. The eighth width W8 may be, for example, 3F, 4F, or 5F.

Figure 30:
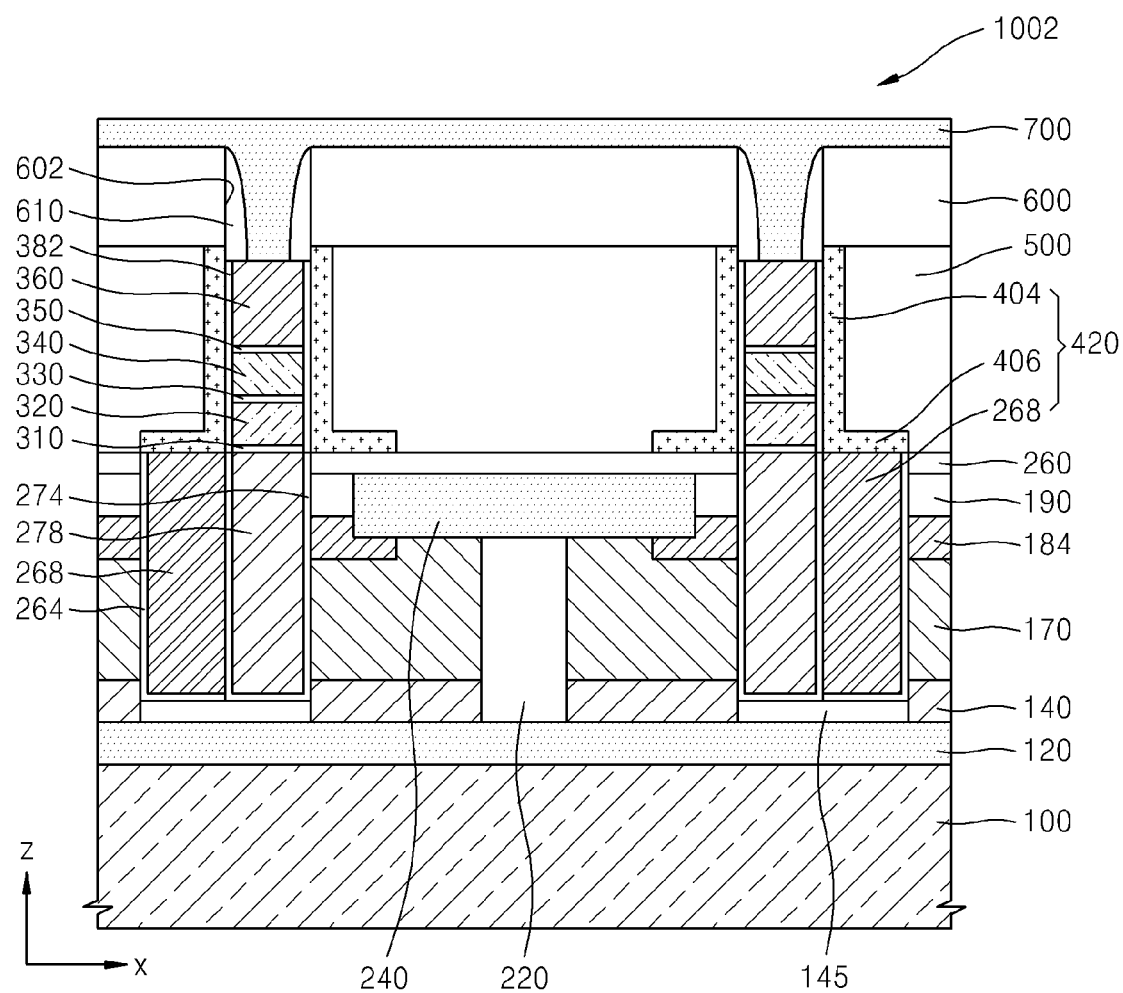
FIGS. 30 to 34 are cross-sectional views illustrating a capacitorless memory device according to another example embodiment of inventive concepts.

Alternatively, although it is not illustrated in FIGS. 12 and 13, the first opening 262 may penetrate the first impurity layer 140 so as to expose the bit lines 120, a result of which is illustrated in FIG. 30.

Figure 14:
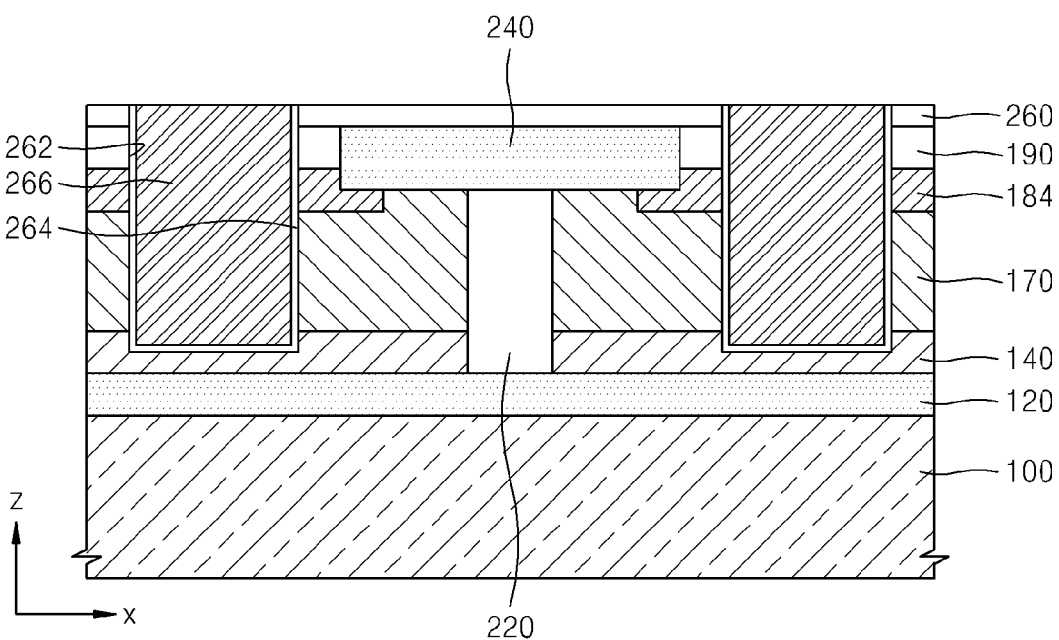
FIG. 14 is a cross-sectional view illustrating a process of forming a conductive embedding material layer, according to an example embodiment of inventive concepts.

FIG. 14 is a cross-sectional view illustrating a process of forming a conductive embedding material layer 266, according to an example embodiment of inventive concepts. Referring to FIG. 14, the conductive embedding material layer 266 is formed to fill the first opening 262. The conductive embedding material layer 266 may be formed of, for example, doped polysilicon or metal. The conductive embedding material layer 266 may be formed of, for example, the doped polysilicon of a first conductive type, or any one of the materials selected from a group consisting of Al, W, Cu, Ti TiN, WN, Ta, TaN, and TiAlN, or a combination thereof.

A first inner wall insulation layer 264 may be formed between an inner wall of the first opening 262 and the conductive embedding material layer 266. The first inner wall insulation layer 264 may be formed of, for example, an oxide, a nitride, or a combination thereof. The first inner wall insulation layer 264 may completely cover the inner wall of the first opening 262, but not to completely fill the first opening 262. The first inner wall insulation layer 264 may be formed by performing a method such as chemical vapor deposition (CVD) or atomic layer deposition (ALD).

The first inner wall insulation layer 264 and the conductive embedding material layer 266 may be formed, for example, by forming a preliminary first inner wall insulation material (not shown) on the substrate 100 to completely cover the inner wall of the first opening 262, forming a preliminary conductive embedding material (not shown) on the substrate 100 to completely fill the first opening 262, and then performing a planarization process until the first cover insulation layer 260 is exposed.

Figure 15:
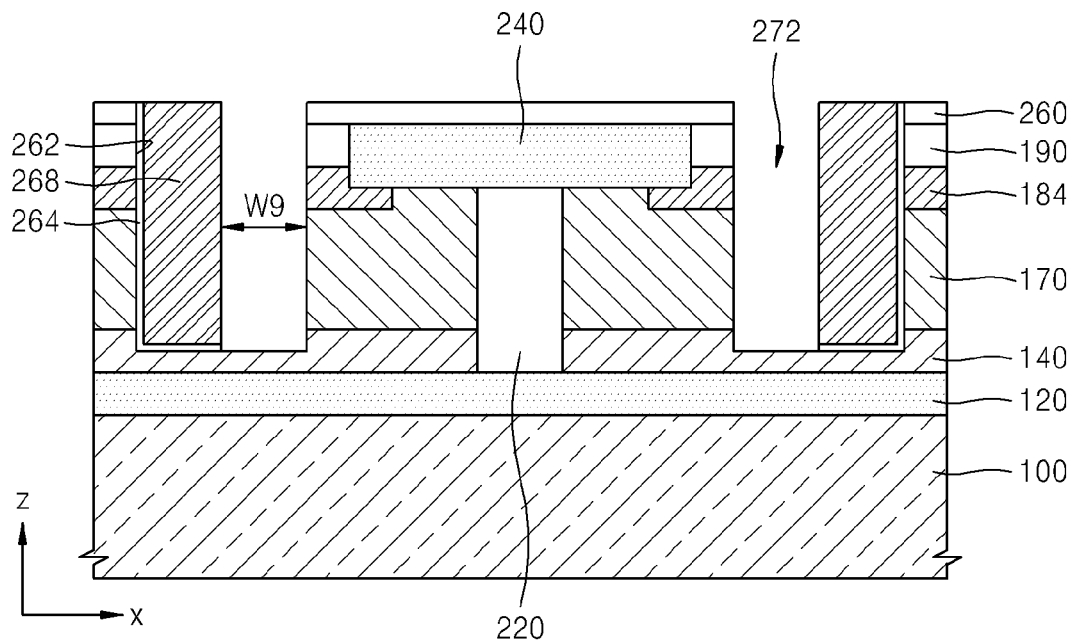
FIG. 15 is a cross-sectional view illustrating a process of forming a second opening, according to an example embodiment of inventive concepts.

FIG. 15 is a cross-sectional view illustrating a process of forming a second opening 272, according to an example embodiment of inventive concepts. Referring to FIGS. 14 and 15, the second opening 272 is formed by removing a part of the conductive embedding material layer 266 filling the first opening 262. A portion of the first inner wall insulation material layer 264 that is exposed as the conductive embedding material layer 266 is removed to form the second opening 272 may be removed as illustrated in FIG. 15 or remain (not shown).

The second opening 272 may be formed by removing a part of the conductive embedding material layer 266. The second opening 272 may be formed by removing a part of the conductive embedding material layer 266 by a ninth width W9. In other words, the second opening 272 may have the ninth width W9 in the first direction x and the seventh width W7 in the second direction y as illustrated in FIG. 12. The ninth width W9 may be, for example, 1F. In other words, the second opening 272 may be an opening having a sectional area of 1F×1F ($1F^2$) of a part of the first opening 262 having a sectional area of 2F×1F ($2F^2$).

Although FIG. 15 illustrates that the second opening 272 is formed in a portion of the first opening 262 that is adjacent to the ground line 240 or the device isolation layer 220, example embodiments of inventive concepts are not limited thereto. The second opening 272 may be formed in a portion of the first opening 262 that is far from the ground line 240 or the device isolation layer 220. Also, the second opening 272 may be formed in a portion of the first opening 262 that is close to the first direction x or a direction reverse to the first direction x.

The portion of the conductive embedding material layer 266 that remains after the second opening 272 is formed may be referred to as a first column portion 268.

Figure 16:
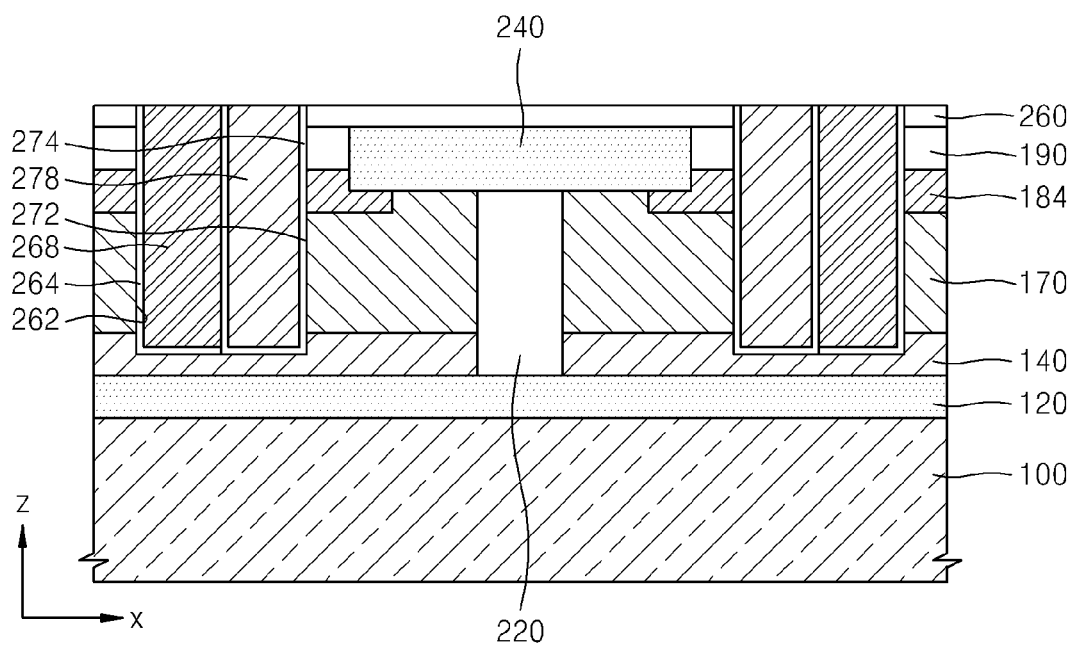
FIG. 16 is a cross-sectional view illustrating a process of forming a second column portion, according to an example embodiment of inventive concepts.

FIG. 16 is a cross-sectional view illustrating a process of forming a second column portion 278, according to an example embodiment of inventive concepts. Referring to FIG. 16, the second column portion 278 is formed to fill the second opening 272. The second column portion 278 may be formed of, for example, doped polysilicon or metal. The second column portion 278 may be formed of, for example, the doped polysilicon of a first conductive type, or any one of the materials selected from a group consisting of Al, W, Cu, Ti, TiN, WN, Ta, TaN, and TiAlN, or a combination thereof.

A second inner wall insulation layer 274 may be formed between an inner wall of the second opening 272 and the second column portion 278. The second inner wall insulation layer 274 may be formed of for example, an oxide, a nitride, or a combination thereof. The second inner wall insulation layer 274 may completely cover the inner wall of the second opening 272, but not to completely fill the second opening 272. The second inner wall insulation layer 274 may be formed by performing a method such as CVD or ALD.

The second inner wall insulation layer 274 and the second column portion 278 may be formed, for example, by forming a preliminary second inner wall insulation material (not shown) on the substrate 100 to completely cover the inner wall of the second opening 272, forming a preliminary column material (not shown) on the substrate 100 to completely fill the second opening 272, and then performing a planarization process until the first cover insulation layer 260 is exposed.

Assuming that the thickness of each of the first and second inner wall insulation layers 164 and 274 is very thin, The first and second column portions 268 and 278 each may have, for example, a rectangular column shape having a sectional area of 1F×1F ($1F^2$).

Although FIG. 16 illustrates that the second column portion 278 that is adjacent to the first column portion 268 is arranged closer to the ground line 240 or the device isolation layer 220 than the first column portion 268, example embodiments of inventive concepts are not limited thereto. The second column portion 278 may be formed farther from the ground line 240 or the device isolation layer 220 than the first column portion 268. Also, the second column portion 278 may be formed close to the first direction x or a direction reverse to the first direction x of the first column portion 268 adjacent thereto.

Figure 17:
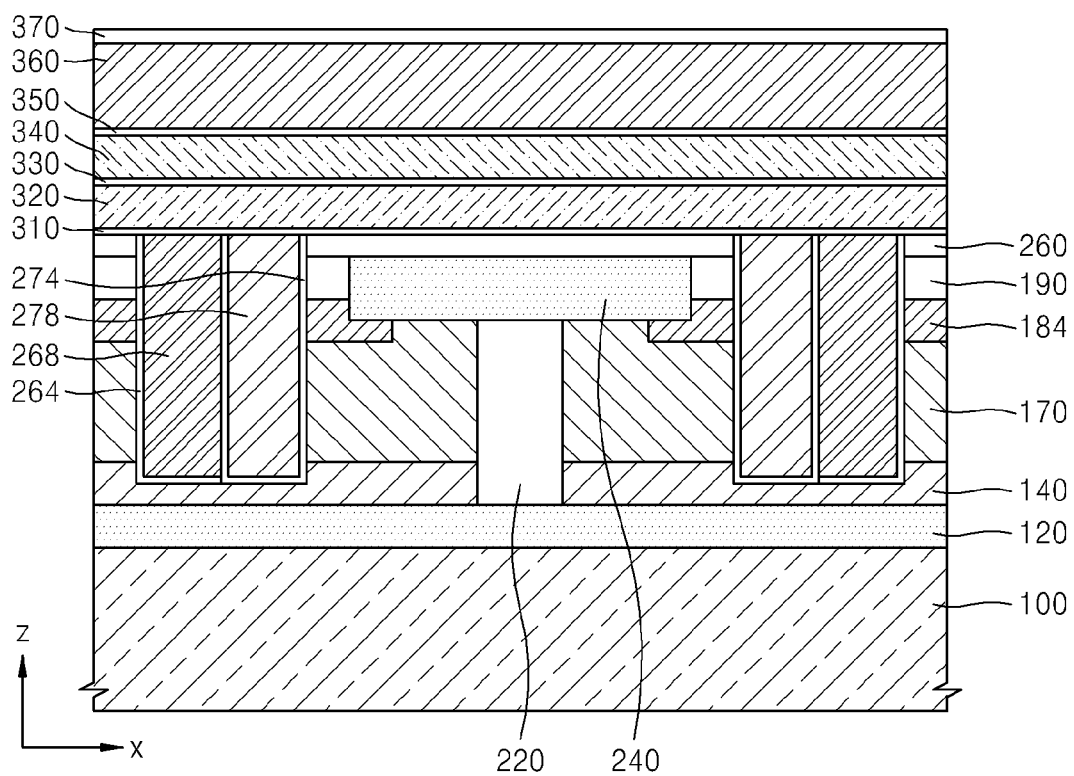
FIG. 17 is a cross-sectional view illustrating a process of forming a first body layer, a second body layer, a drain layer, and a drain cover insulation layer, according to an example embodiment of inventive concepts.

FIG. 17 is a cross-sectional view illustrating a process of forming a first body layer 320, a second body layer 340, a drain layer 360, and a drain cover insulation layer 370, according to an example embodiment of inventive concepts. Referring to FIG. 17, the first body layer 320, the second body layer 340, the drain layer 360, and the drain cover insulation layer 370 may cover the substrate 100 where the first and second column portions 268 and 278 are formed. The first and second body layers 320 and 340 may be formed of an intrinsic semiconductor material. For example, the first and second body layers 320 and 340 may be formed of undoped polysilicon. The drain layer 360 may be formed of, for example, doped polysilicon or metal. The drain layer 360 may be formed of, for example, the doped polysilicon of a first conductive type, or any one of the materials selected from a group consisting of Al, W, Cu, Ti, TiN, WN, Ta, TaN, and TiAlN, or a combination thereof.

The first and second body layers 320 and 340 may be referred to as a body layer.

A source barrier layer 310 may be further formed before the first body layer 320 is formed. A shutter layer 330 may be further formed between the first and second body layers 320 and 340. A drain barrier layer 350 may be further formed between the second body layer 340 and the drain layer 360. When the shutter layer 330 is formed, the first body layer 320, the shutter layer 330, and the second body layer 340 may be referred to as a body layer.

The source barrier layer 310, the shutter layer 330, and the drain barrier layer 350 may be formed of, for example, an oxide, a nitride, or a combination thereof. The shutter layer 330 may be thicker than each of the source barrier layer 310 and the drain barrier layer 350.

Figure 18:
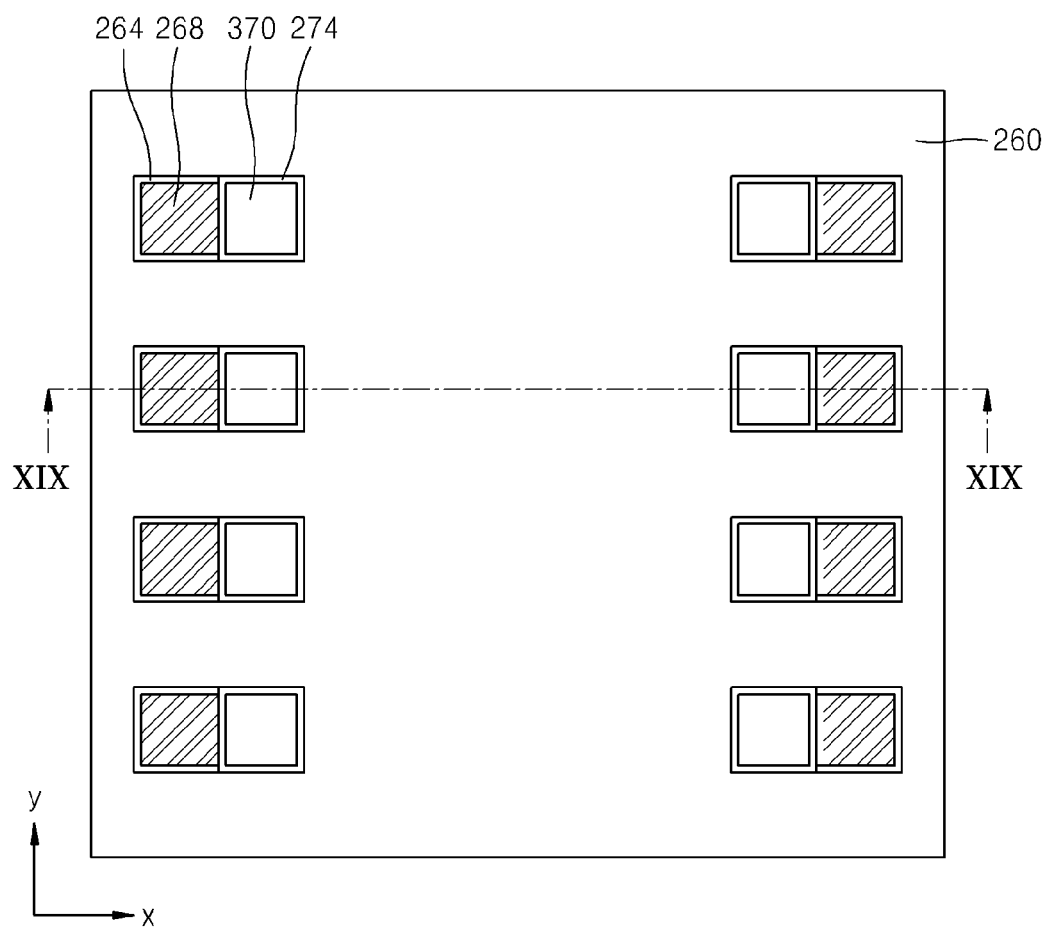
FIGS. 18 and 19 are respectively a plan view and a cross-sectional view illustrating a process of removing parts of a source barrier layer, a first body layer, a shutter layer, a second body layer, a drain barrier layer, a drain layer, and a drain cover insulation layer, according to an example embodiment of inventive concepts.
Figure 19:
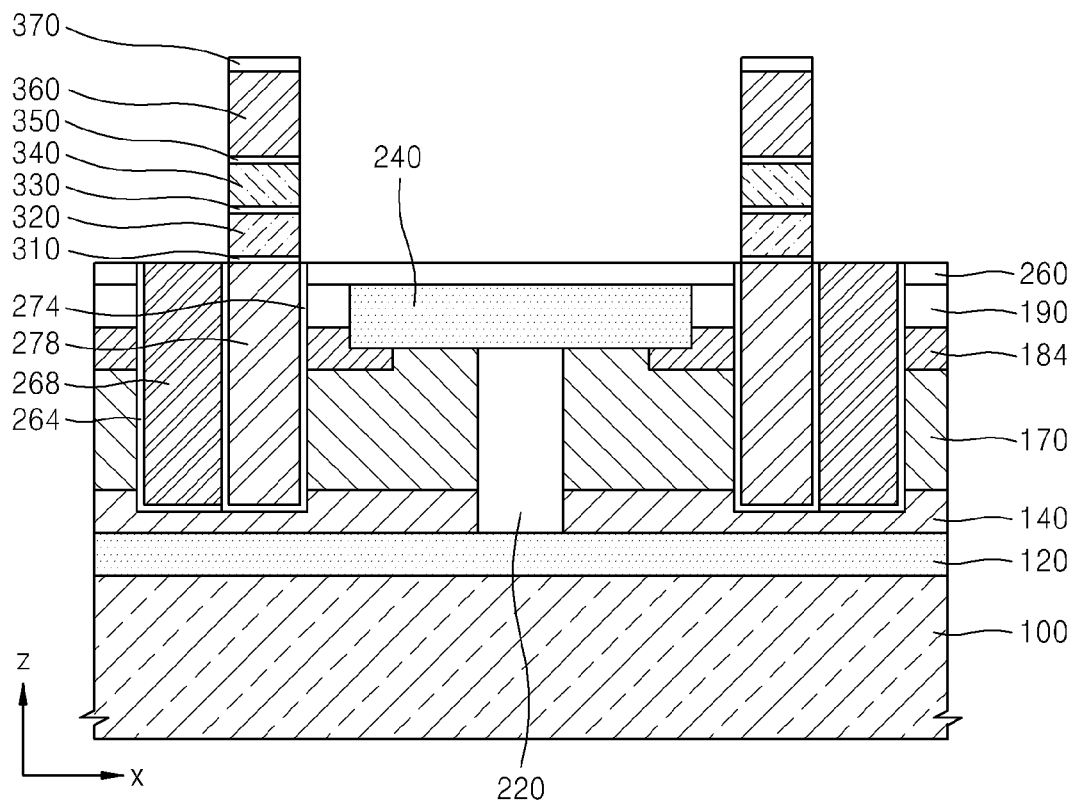

FIGS. 18 and 19 are respectively a plan view and a cross-sectional view illustrating a process of removing parts of the source barrier layer 310, the first body layer 320, the shutter layer 330, the second body layer 340, the drain barrier layer 350, the drain layer 360, and the drain cover insulation layer 370, according to an example embodiment of inventive concepts. In detail, FIG. 19 is a cross-sectional view taken along line XIX-XIX of FIG. 18.

Referring to FIGS. 18 and 19, parts of the source barrier layer 310, the first body layer 320, the shutter layer 330, the second body layer 340, the drain barrier layer 350, the drain layer 360, and the drain cover insulation layer 370 are removed so that a portion that is above the second column portion 278, that is, a portion that is on the second column portion 278 in the third direction z, of the source barrier layer 310, the first body layer 320, the shutter layer 330, the second body layer 340, the drain barrier layer 350, the drain layer 360, and the drain cover insulation layer 370 may remain. The parts of the source barrier layer 310, the first body layer 320, the shutter layer 330, the second body layer 340, the drain barrier layer 350, the drain layer 360, and the drain cover insulation layer 370 that remain above the second column portion 278 may have a column shape.

When the parts of the source barrier layer 310, the first body layer 320, the shutter layer 330, the second body layer 340, the drain barrier layer 350, the drain layer 360, and the drain cover insulation layer 370 are removed, the first cover insulation layer 260, the first column portion 268, and the first inner wall insulation layer 264 may be exposed. Although the second inner wall insulation layer 274 is illustrated as exposed, the second inner wall insulation layer 274 may be covered by the remaining parts of the source barrier layer 310, the first body layer 320, the shutter layer 330, the second body layer 340, the drain barrier layer 350, the drain layer 360, and the drain cover insulation layer 370. The upper surface of the first column portion 268 may be completely exposed by the remaining parts of the source barrier layer 310, the first body layer 320, the shutter layer 330, the second body layer 340, the drain barrier layer 350, the drain layer 360, and the drain cover insulation layer 370.

Any one of the exposed first and second column portions 268 and 278 may be referred to as a gate column portion 268. Any one of the first and second column portions 268 and 278 that is not exposed may be referred to as a source layer 278. In other words, any one of the first and second column portions 268 and 278 that is adjacent to the ground line 240 may be referred to as the source layer 278, whereas the other one may be referred to as the gate column portion 268.

The first of the first and second column portions 268 and 278 that is formed may be referred to as a first-formed first column portion 268 and the next one may be referred to as a later-formed second column portion 278 depending on the order in a forming process. However, the gate column portion 268 and the source layer 278 are named in consideration of the function to be performed by a capacitorless memory cell to manufacture. Thus, as it is described with reference to FIGS. 15 and 16, when the positions of the second opening 272 and the second column portion 278 in the first opening 262 are changed, the terms "gate column portion" and "source layer" respectively corresponding to "the first column portion" and "the second column portion" may be changed.

Figure 20:
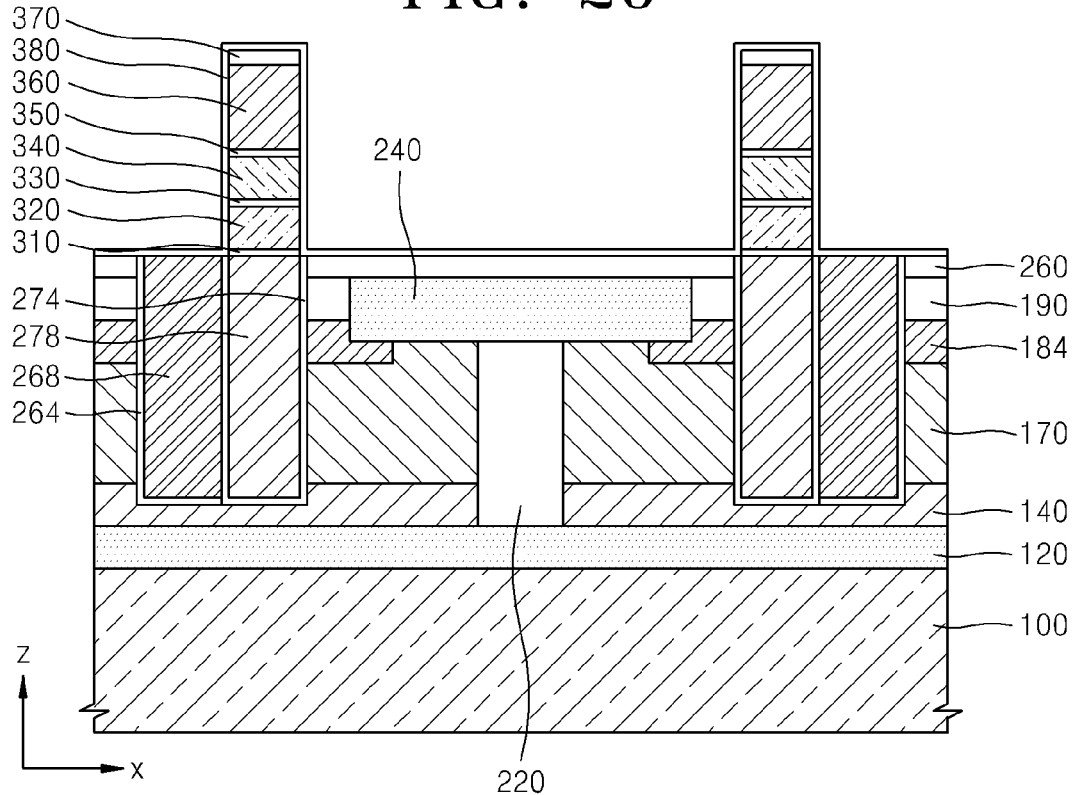
FIG. 20 is a cross-sectional view illustrating a process of forming a second cover insulation layer, according to an example embodiment of inventive concepts.

FIG. 20 is a cross-sectional view illustrating a process of forming a second cover insulation layer 380, according to an example embodiment of inventive concepts. Referring to FIG. 20, the second cover insulation layer 380 is formed on the substrate 100 where an exposed upper surface of the gate column portion 268. The second cover insulation layer 380 may completely cover side surfaces of the source barrier layer 310, the first body layer 320, the shutter layer 330, the second body layer 340, the drain barrier layer 350, the drain layer 360, and the drain cover insulation layer 370, and the upper surface of the drain cover insulation layer 370. The second cover insulation layer 380 may be formed of, for example, an oxide, a nitride, or a combination thereof. The second cover insulation layer 380 may be formed by performing a method such as CVD or ALD.

Figure 21:
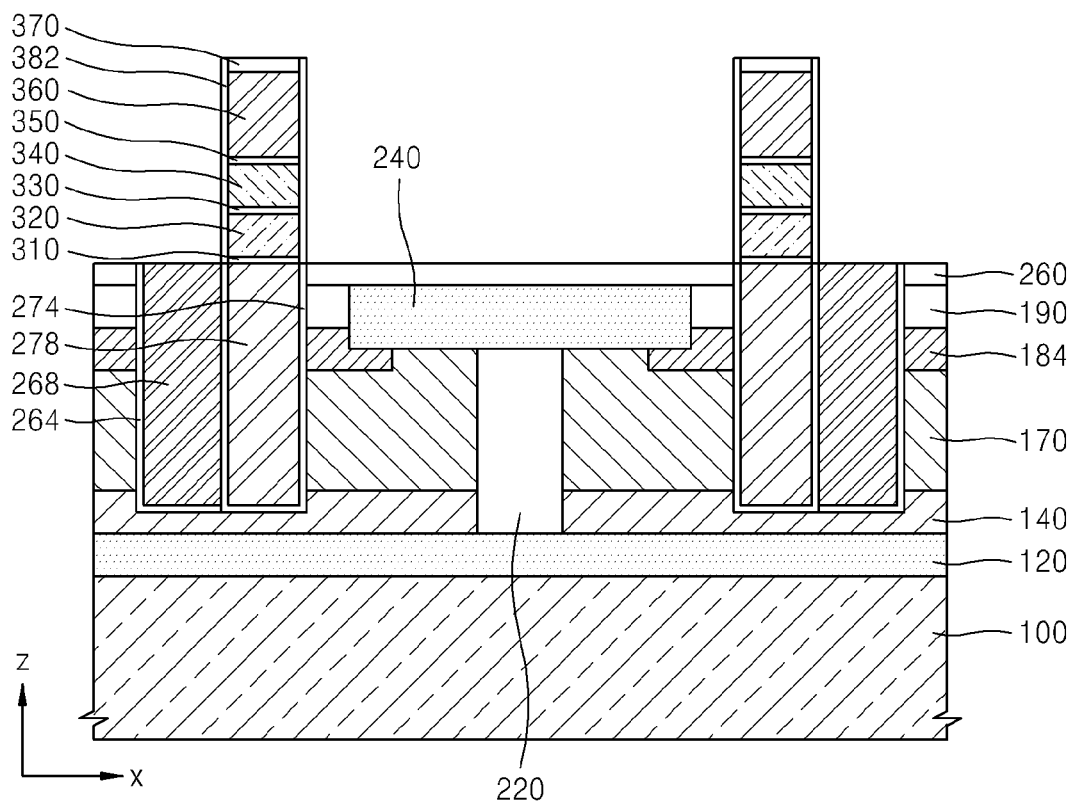
FIG. 21 is a cross-sectional view illustrating a process of removing a part of the second cover insulation layer, according to an example embodiment of inventive concepts.

FIG. 21 is a cross-sectional view illustrating a process of removing a part of the second cover insulation layer 380, according to an example embodiment of inventive concepts. Referring to FIGS. 20 and 21, the upper surface of the gate column portion 268 is exposed, and a side wall spacer insulation layer 382 remaining on side surfaces of the source barrier layer 310, the first body layer 320, the shutter layer 330, the second body layer 340, the drain barrier layer 350, the drain layer 360, and the drain cover insulation layer 370 is formed by removing the part of the second cover insulation layer 380. Thus, the side wall spacer insulation layer 382 may remain with a spacer shape on the side surfaces of the source barrier layer 310, the first body layer 320, the shutter layer 330, the second body layer 340, the drain barrier layer 350, the drain layer 360, and the drain cover insulation layer 370 that have a column shape.

Figure 22:
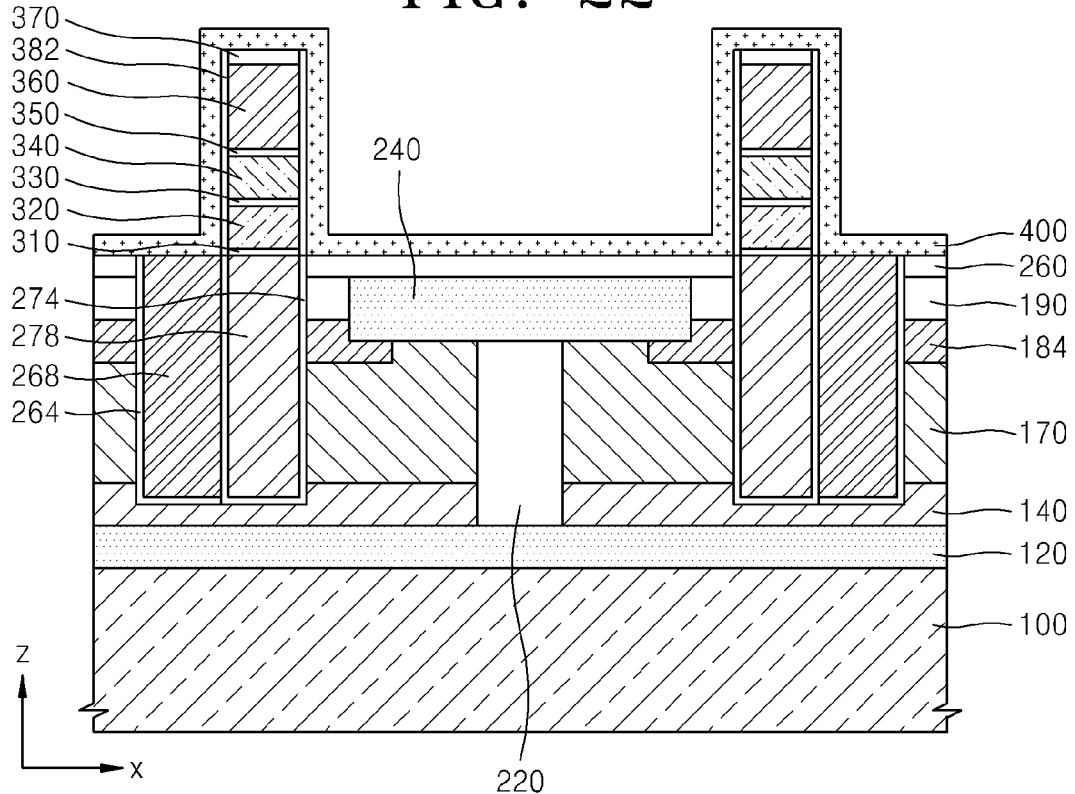
FIG. 22 is a cross-sectional view illustrating a process of forming a gate extension material layer, according to an example embodiment of inventive concepts.

FIG. 22 is a cross-sectional view illustrating a process of forming a gate extension material layer 400, according to an example embodiment of inventive concepts. Referring to FIG. 22, after the side wall spacer insulation layer 382 is formed, the gate extension material layer 400 is formed on the substrate 100 to cover the substrate 100. The gate extension material layer 400 may be formed of, for example, the doped polysilicon of a first conductive type, or any one of the materials selected from a group consisting of Al, W, Cu, Ti, TiN, WN Ta, TaN, and TiAlN, or a combination thereof.

Figure 23:
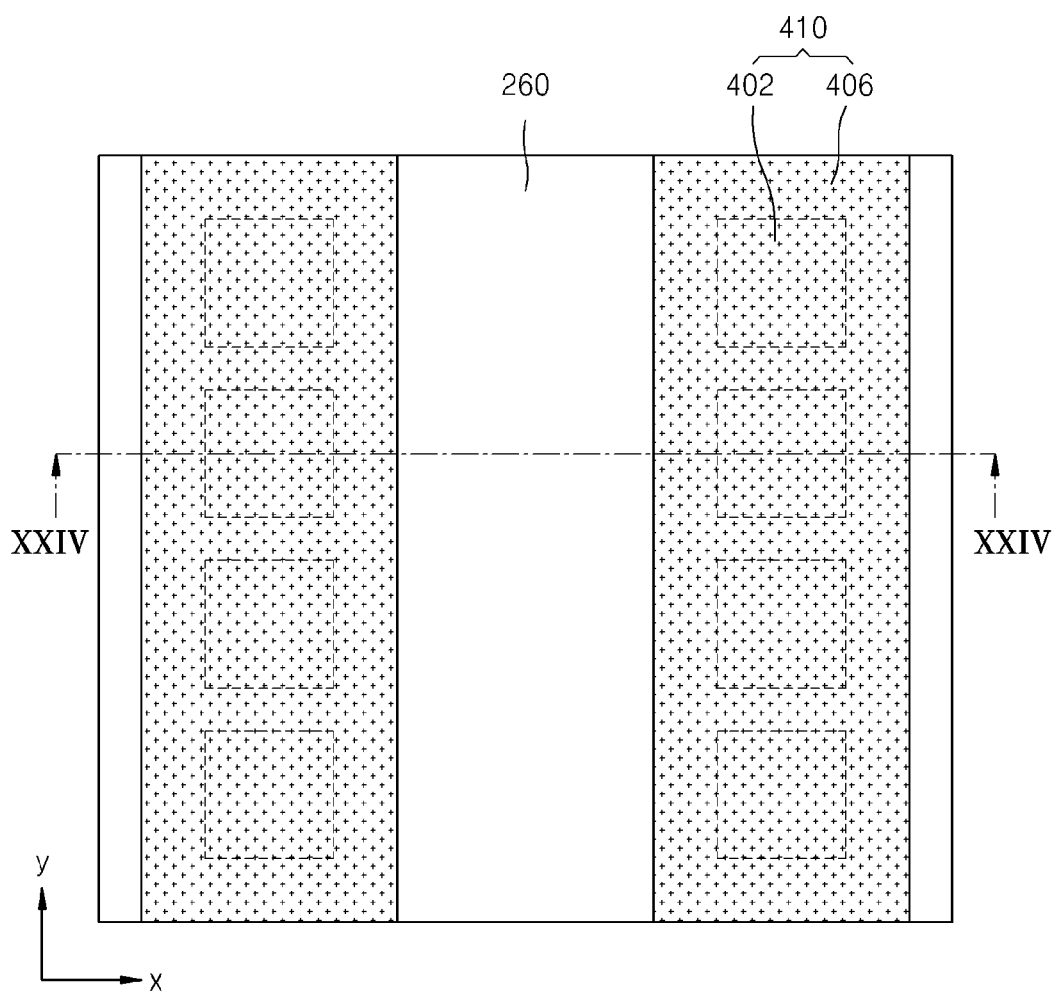
FIGS. 23 and 24 are respectively a plan view and a cross-sectional view illustrating a process of forming a remaining gate extension material layer, according to an example embodiment of inventive concepts.
Figure 24:
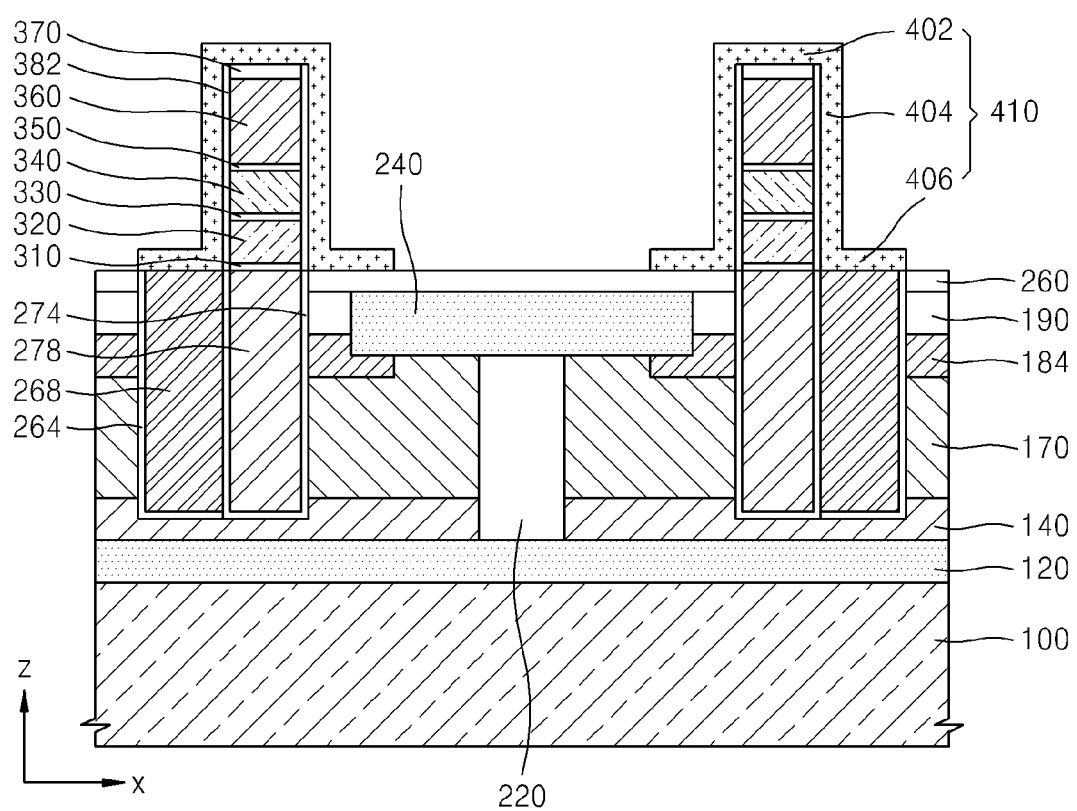

FIGS. 23 and 24 are respectively a plan view and a cross-sectional view illustrating a process of forming a remaining gate extension material layer 410, according to an example embodiment of inventive concepts. In detail, FIG. 24 is a cross-sectional view taken along line XXIV-XXIV of FIG. 23.

Referring to FIGS. 23 and 24, the remaining gate extension material layer 410 extending in the second direction y is formed by removing a part of the gate extension material layer 400. The remaining gate extension material layer 410 may include a side wall portion 404 arranged on the side wall spacer insulation layer 382, a cover portion 402 arranged on the drain cover insulation layer 370, and an extension portion 406 arranged on a plane at the same level as an upper surface of the second cover insulation layer 260. The extension portion 406 may cover the gate column portion 268 and may be electrically connected to the gate column portion 268.

Figure 25:
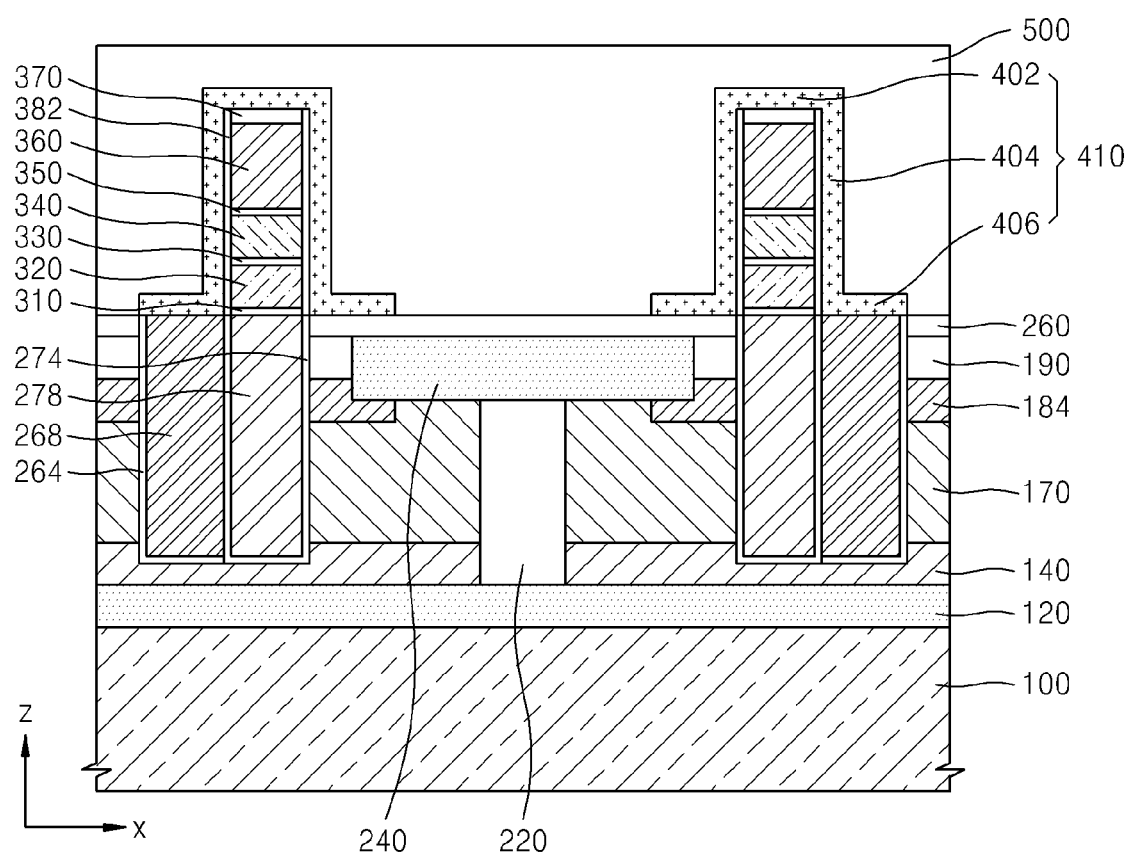
FIG. 25 is a cross-sectional view illustrating a process of forming a first interlayer insulation layer, according to an example embodiment of inventive concepts.

FIG. 25 is a cross-sectional view illustrating a process of forming a first interlayer insulation layer 500, according to an example embodiment of inventive concepts. Referring to FIG. 25, the first interlayer insulation layer 500 is formed on the substrate 100 to cover the remaining gate extension material layer 410. The first interlayer insulation layer 500 may be formed of, for example, an oxide such as phosphorus silicate glass (PSG), boron phosphorus silicate glass (BPSG), fluorine-doped silicate glass (FSG), undoped silicate glass (USG), tetraethyl orthosilicate (TEOS), high temperature oxide (HTO), or low temperature oxide (LTO), or an insulation material such as SiOC or SiLK, but is not limited thereto.

Figure 26:
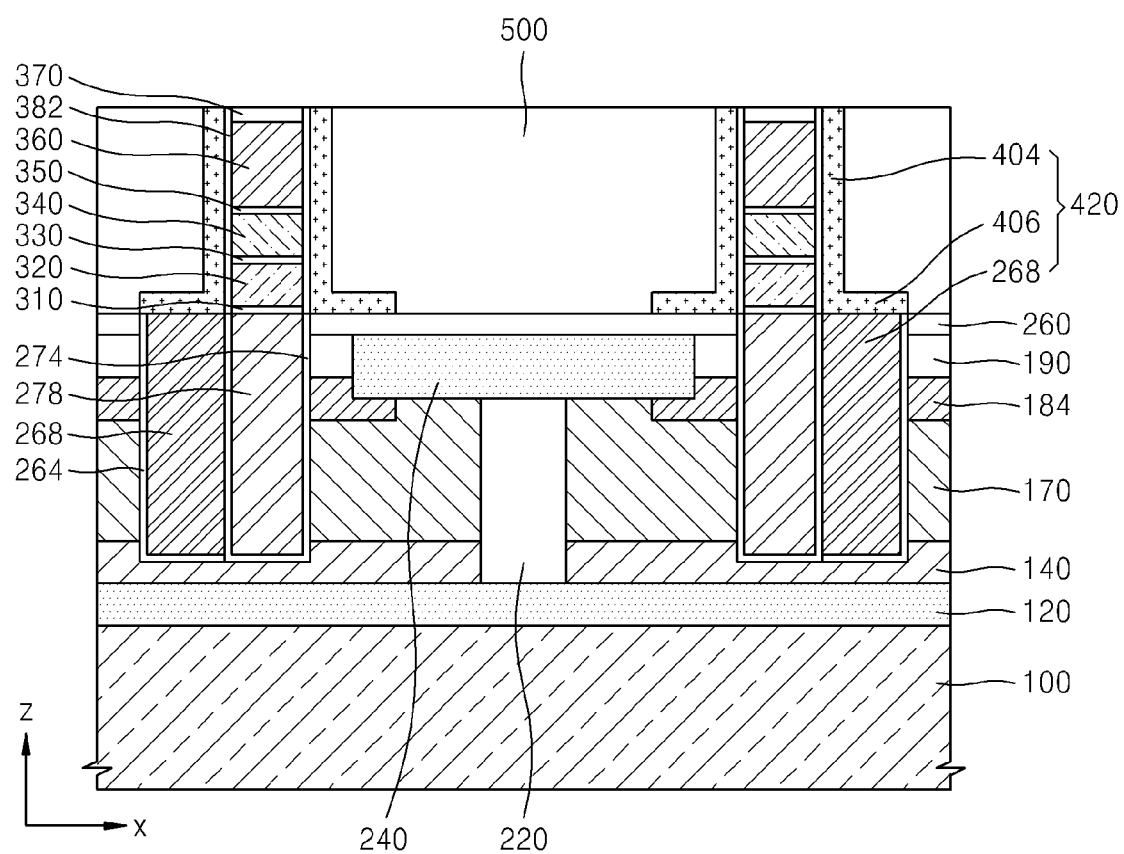
FIG. 26 is a cross-sectional view illustrating a process of forming a gate line, according to an example embodiment of inventive concepts.

FIG. 26 is a cross-sectional view illustrating a process of forming a gate line 420, according to an example embodiment of inventive concepts. Referring to FIGS. 23, 25, and 26, the gate line 420 is formed by removing a part of the first interlayer insulation layer 500 and the cover portion 402. CMP may be performed to form the gate line 420. The drain cover insulation layer 370 may be exposed by removing the part of the first interlayer insulation layer 500 and the cover portion 402. The cover portion 402 is removed to expose the drain cover insulation layer 370 so that the side wall portion 404 may extend above the upper surface of the drain layer 360.

The gate line 420 may include the extension portion 406 that extends in the second direction y, the side wall portion 404 arranged on the side wall spacer insulation layer 382, and the gate column portion 268. In other words, the gate line 420 extends in the second direction y and may apply an electric field to the first and second body layers 320 and 340 via the side wall portion 404. The side wall portion 404 of the gate line 420 may completely cover the side surfaces of the source barrier layer 310, the first body layer 320, the shutter layer 330, the second body layer 340, the drain barrier layer 350, the drain layer 360, and the drain cover insulation layer 370 that have a column shape. The gate line 420, particularly the side wall portion 404, may completely surround the side surfaces of the first body layer 320, the shutter layer 330, and the second body layer 340. Also, the gate line 420, particularly the side wall portion 404, may completely surround the side surface of the drain layer 360. The gate line 420 may apply an electric field to the source layer 278 via the gate column portion 268.

The gate line 420 and the ground line 240 both may extend in the second direction y. Thus, the gate line 420 and the ground line 240 extending in the second direction y may extend in a direction different from the bit lines 120 extending in the first direction x.

Figure 27:
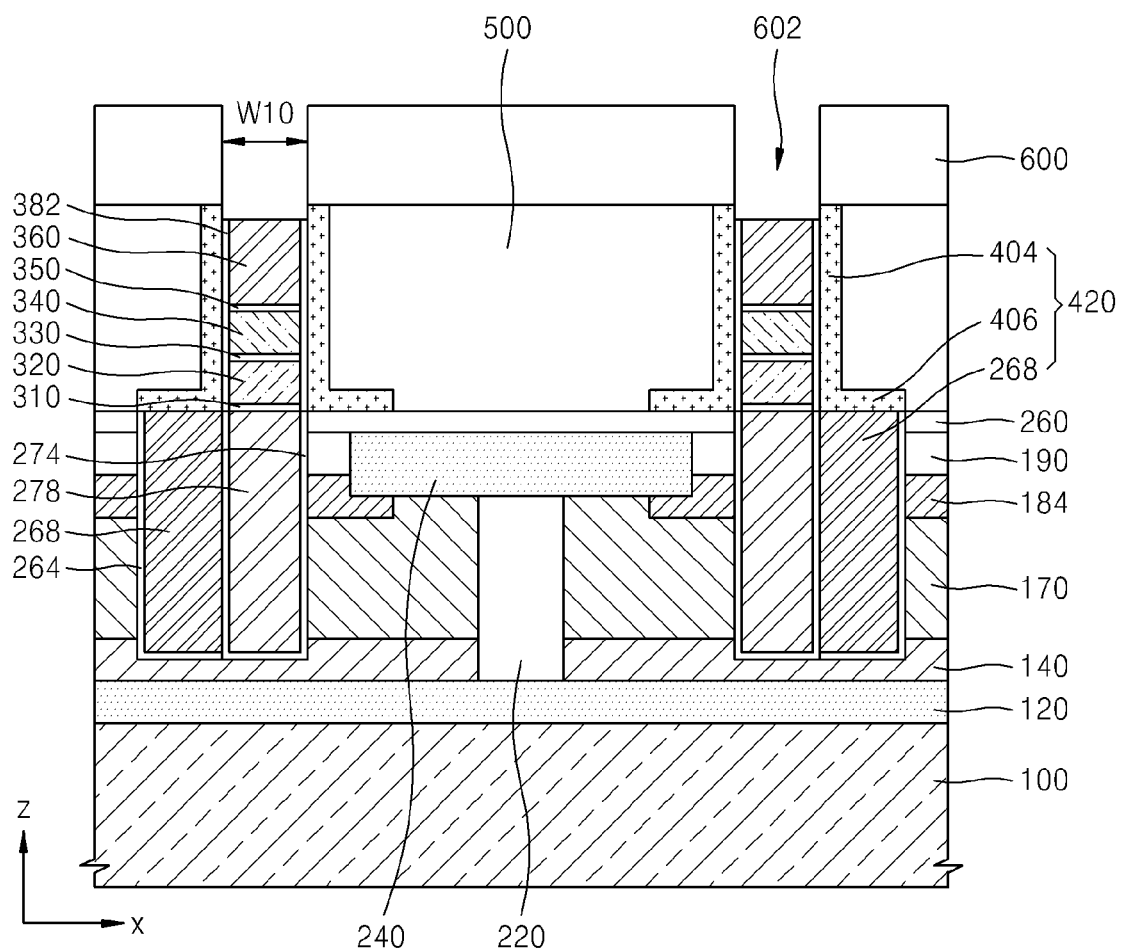
FIG. 27 is a cross-sectional view illustrating a process of forming a second interlayer insulation layer and a third opening according to an example embodiment of inventive concepts.

FIG. 27 is a cross-sectional view illustrating a process of forming a second interlayer insulation layer 600 and a third opening 602, according to an example embodiment of inventive concepts. Referring to FIG. 27, the second interlayer insulation layer 600 having the third opening 602 is formed on the first interlayer insulation layer 500. The third opening 602 may penetrate the second interlayer insulation layer 600 to expose the drain layer 360. The third opening 602 may have a cross-section of a polygonal shape having a tenth width W10 or an oval shape having a diameter of the tenth width W10. The tenth width W10 may be, for example, 1F.

The second interlayer insulation layer 600 may be formed of, for example, an oxide such PSG, BPSG, FSG, USG, TEOS, HTO, or LTO, or an insulation material such as SiOC or SiLK, but is not limited thereto.

Figure 28:
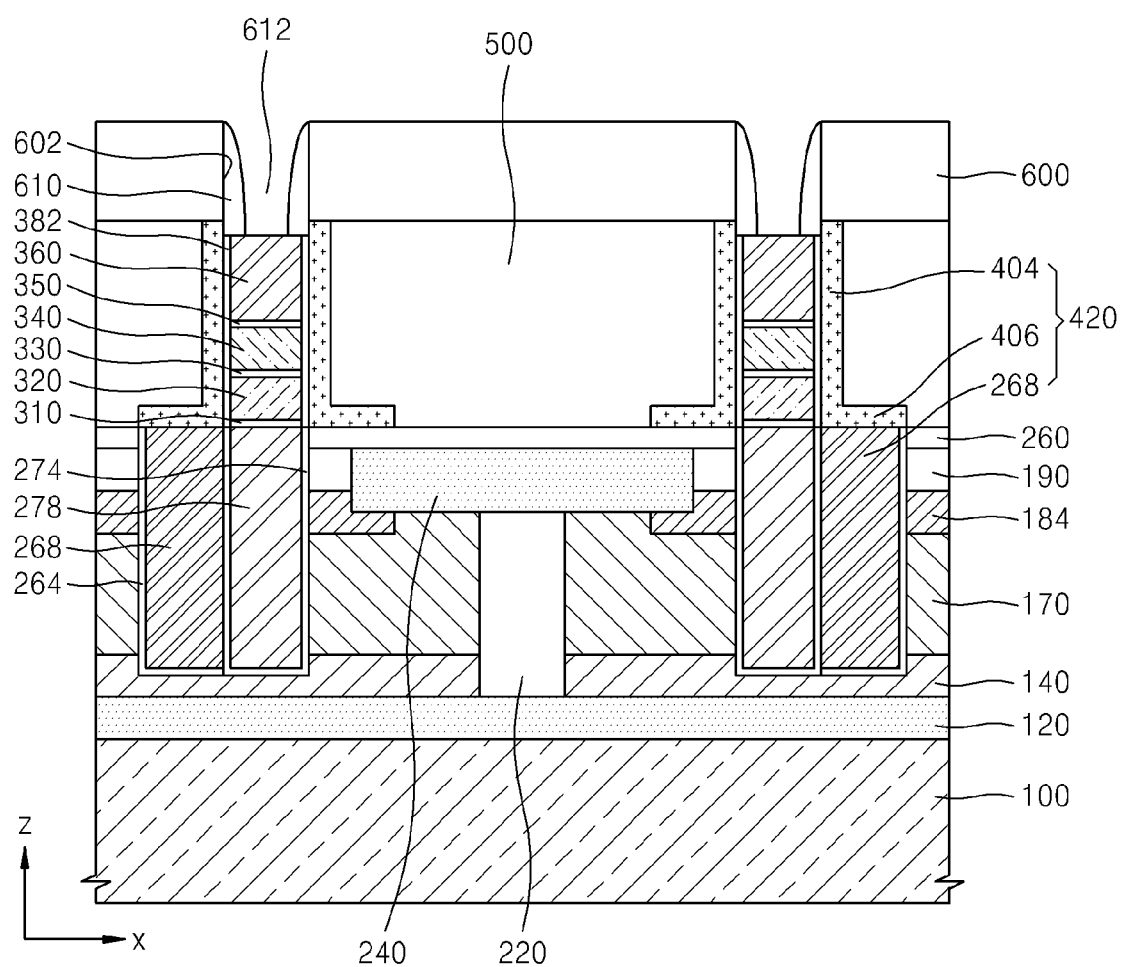
FIG. 28 is a cross-sectional view illustrating a process of forming a spacer layer, according to an example embodiment of inventive concepts.

FIG. 28 is a cross-sectional view illustrating a process of forming a spacer layer 610, according to an example embodiment of inventive concepts. Referring to FIG. 28, the spacer layer 610 is formed on a side wall of the third opening 602. The spacer layer 610 may be formed by performing an anisotropic etch process after forming a preliminary spacer layer (not shown) on the second interlayer insulation layer 600 where the third opening 602 is formed. The reduced third opening 612 may be formed in the spacer layer 610. The spacer layer 610 may be formed of a silicon oxide, a silicon nitride, or a combination thereof.

Figure 29:
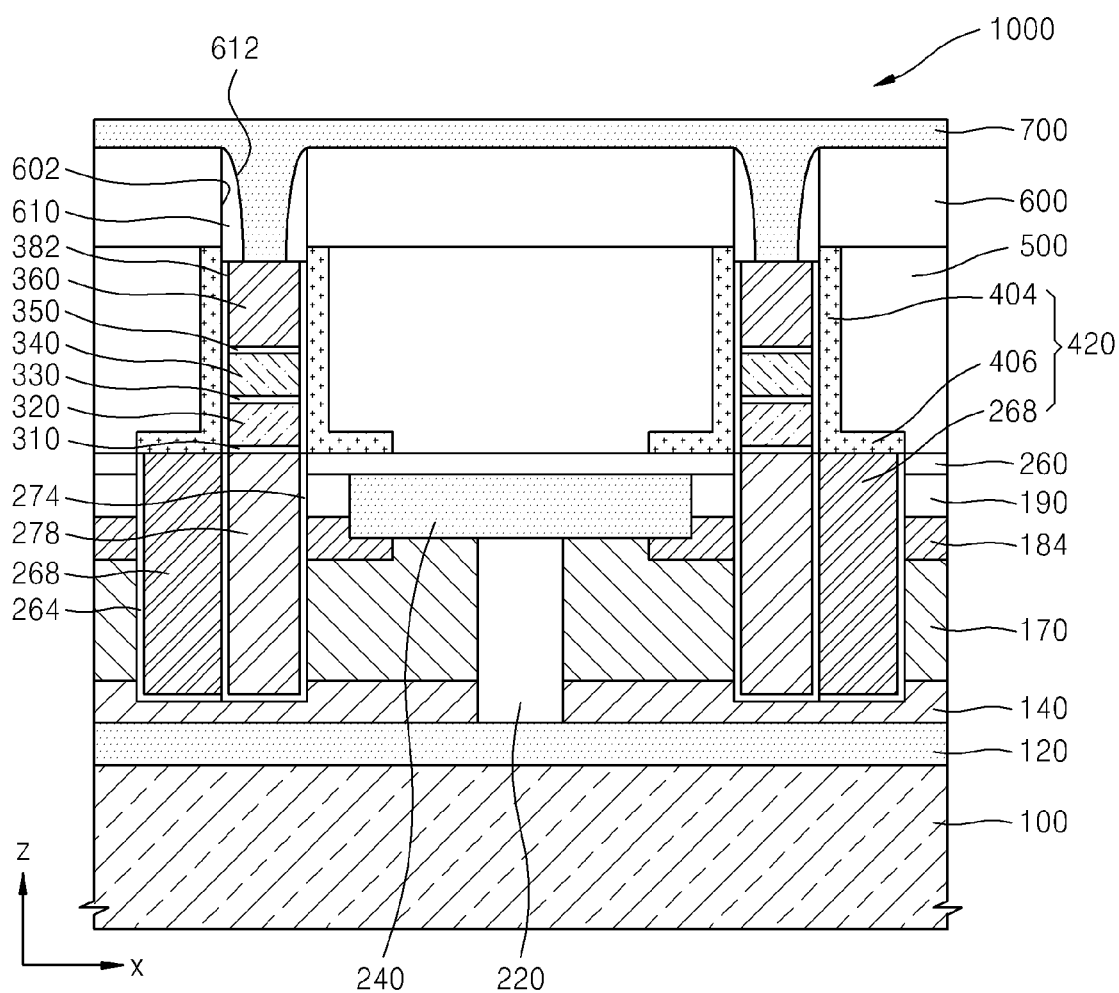
FIG. 29 is a cross-sectional view illustrating a capacitorless memory device according to an example embodiment of inventive concepts.

FIG. 29 is a cross-sectional view illustrating a capacitorless memory device 1000 according to an example embodiment of inventive concepts. Referring to FIG. 29, a data word line 700 is formed on the second interlayer insulation layer 600 where the reduced third opening 612 is formed, and thus, the capacitorless memory device 1000 is completely formed. The data word line 700 extending on the second interlayer insulation layer 600 in one direction may be formed on the substrate 100 by forming a preliminary data word line material to fill the reduced third opening 612 and removing a part of the preliminary data word line material formed on the second interlayer insulation layer 600. After a conductive material having a plug shape filling the reduced third opening 612 is first formed, a conductive material having a line shape electrically connected to the conductive material having a plug shape and extending in one direction on the second interlayer insulation layer 600 is formed so that the data word line 700 may be completely formed.

The data word line 700 may extend, for example, in the first direction x on the second interlayer insulation layer 600. Thus, the data word line 700 may extend in the same direction as the bit lines 120, e.g., in different direction from the gate line 420 and the ground line 240.

FIG. 30 is cross-sectional views illustrating a capacitorless memory device 1002 according to another example embodiment of inventive concepts. Referring to FIGS. 29 and 30, unlike the capacitorless memory device 1000 of FIG. 29, the first impurity layer 140 may not be arranged under the gate column portion 268 and the source layer 278 in the capacitorless memory device 1002 of FIG. 30. In other words, when the first opening 262 is formed, as illustrated in FIGS. 12 and 13, the first opening 262 penetrates the first impurity layer 140 so that the capacitorless memory device 1002 may be formed.

To inhibit (and/or prevent) interference between the bit lines 120 and the source layer 278, an anti-interference insulation layer 145 may be further provided selectively between the bit lines 120 and the source layer 278. The anti-interference insulation layer 145 may be formed between the bit lines 120 and the source layer 278 and between the bit lines 120 and the gate column portion 268, as illustrated FIG. 30. Alternatively, the anti-interference insulation layer 145 may be formed only between the bit lines 120 and the source layer 278, and not between the bit lines 120 and the gate column portion 268. The anti-interference insulation layer 145 may be formed, for example, by forming the first opening 262 of FIGS. 12 and 13 and/or after forming the second opening 272 of FIG. 15 and then filling a part of a lower surface of the first opening 262 and/or the second opening 272 with an insulation material, such as silicon oxide.

Figure 31:
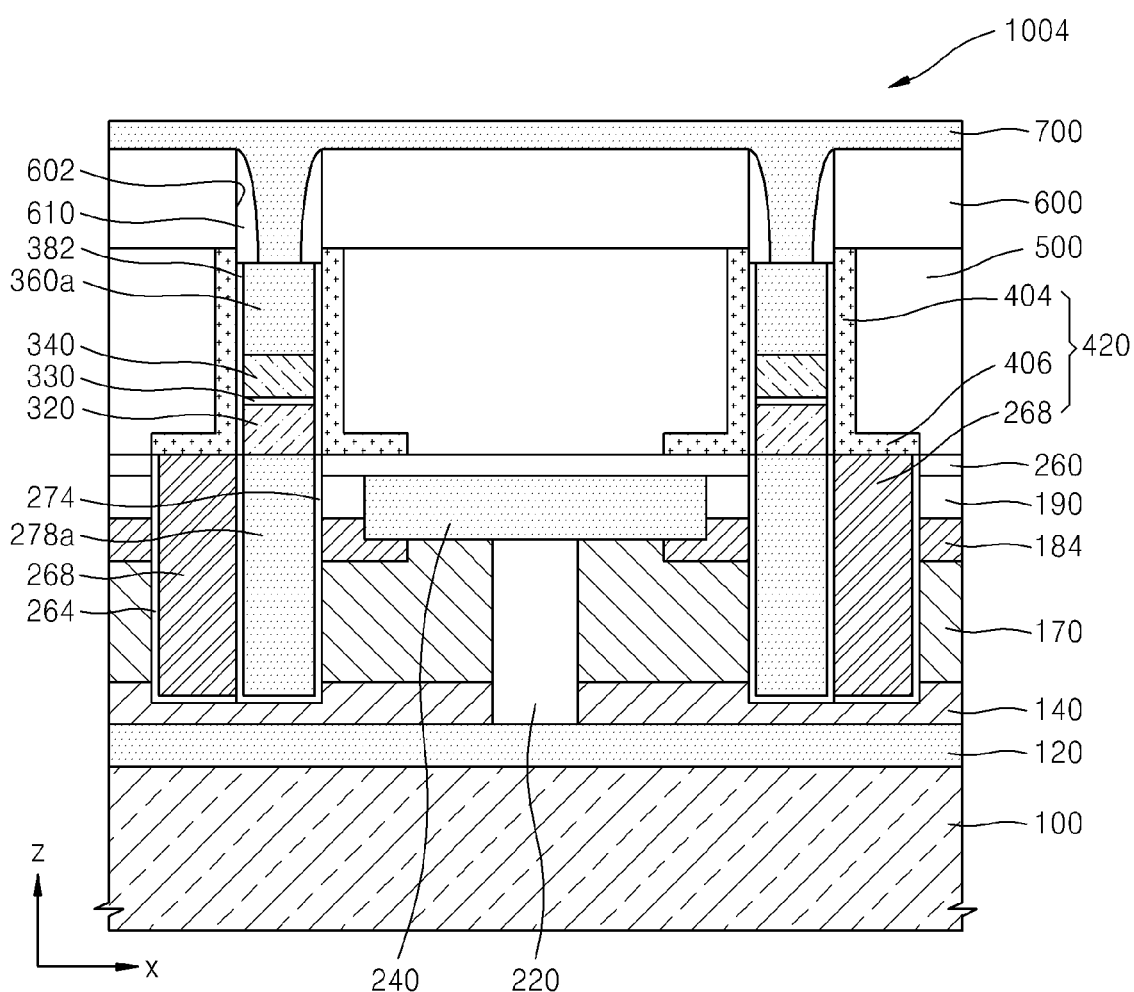

FIG. 31 is a cross-sectional view illustrating a capacitorless memory device 1004 according to another example embodiment of inventive concepts. Referring to FIGS. 29 and 31, the capacitorless memory device 1004 of FIG. 31 may not include the source barrier layer 310 and the drain barrier layer 350 of the capacitorless memory device 1000 of FIG. 29.

In the capacitorless memory device 1000 of FIG. 29, the source layer 278 and the drain layer 360 are formed of doped polysilicon and the source barrier layer 310 and the drain barrier layer 350 are used to control an operational current through the source layer 278 and the drain layer 360. In the capacitorless memory device 1004 of FIG. 31 however, a source layer 278a and a drain layer 360a may be formed of metal so that a Schottky contact is formed between the source layer 278a and the first body layer 320, and the drain layer 360a and the second body layer 340, thereby controlling an operational current. In other words, the source layer 278a and the first body layer 320 may form a first Schottky contact, and the drain layer 360a and the second body layer 340 may form a second Schottky contact.

FIG. 32 is a cross-sectional view illustrating a capacitorless memory device 1006 according to another example embodiment of inventive concepts. Referring to FIGS. 29 and 32, in the capacitorless memory device 1000 of FIG. 29, the ground line 240 and the remained third impurity layer 184 are electrically connected to each other and the ground line 240 and the extended second impurity layer 170 are directly and electrically connected to each other. In the capacitorless memory device 1006 of FIG. 32, however, the second impurity layer 160 may not be directly and electrically connected to the ground line 240 and only the third impurity layer 180 may be directly and electrically connected to the ground line 240. The capacitorless memory device 1006 of FIG. 32 may be formed by the process described with reference to FIG. 10.

Figure 33:
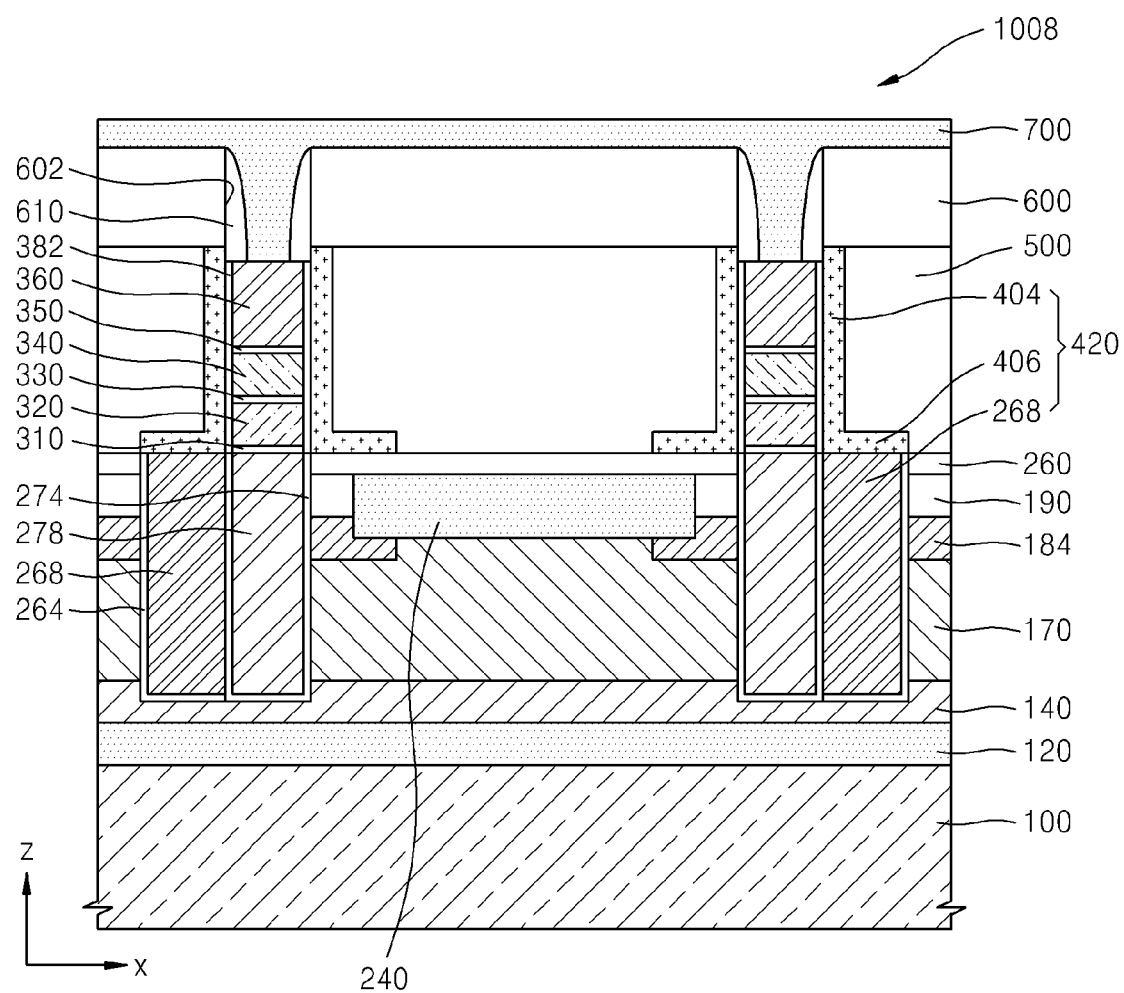

FIG. 33 is a cross-sectional view illustrating a capacitorless memory device 1008 according to another example embodiment of inventive concepts. Referring to FIGS. 29 and 33, the device isolation layer 220 in the capacitorless memory device 1000 of FIG. 29 may not be formed in the capacitorless memory device 1008 of FIG. 33. In other words, the capacitorless memory device 1009 may be formed by omitting the process of forming the second trench 114 and the device isolation layer 220 illustrated in FIGS. 6 and 7.

Figure 34:
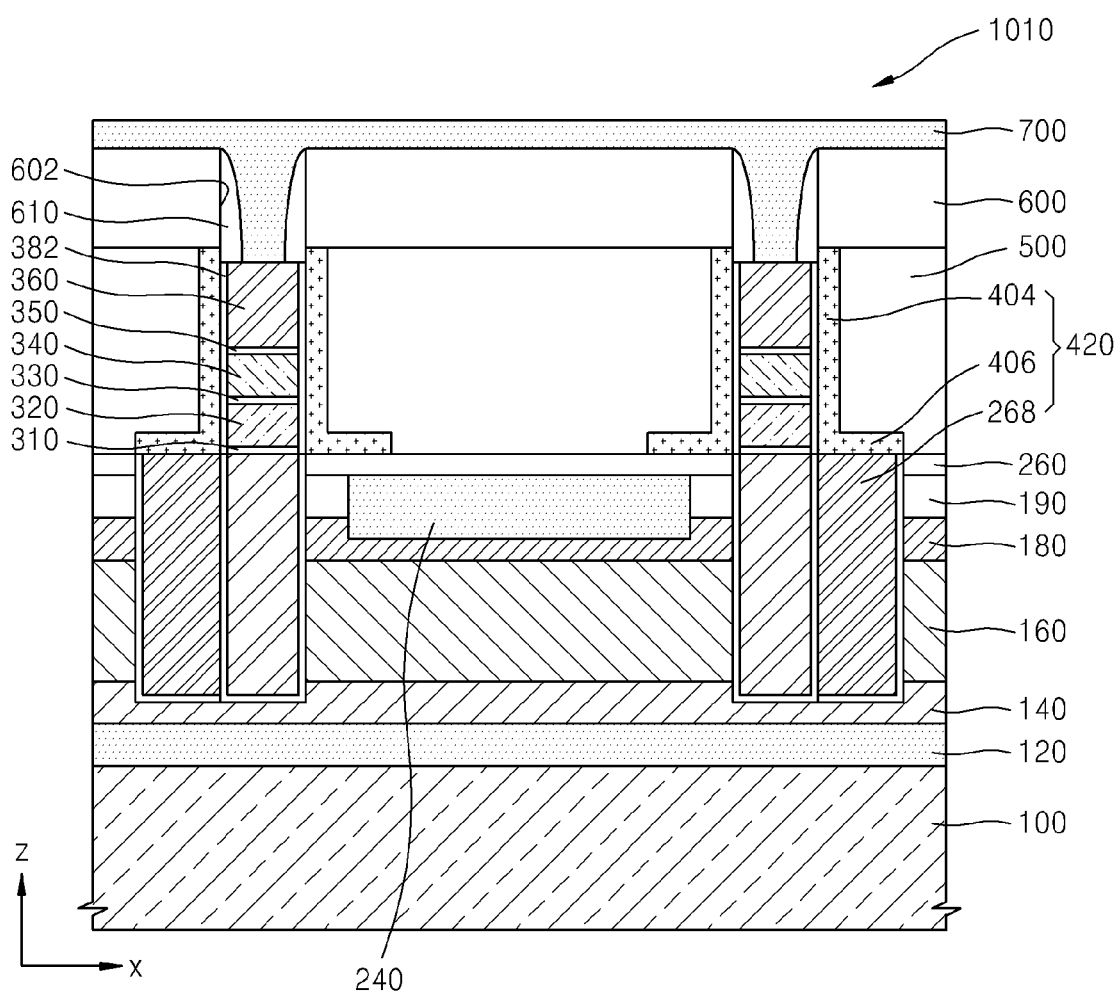

FIG. 34 is a cross-sectional view illustrating a capacitorless memory device 1010 according to another example embodiment of inventive concepts. Referring to FIGS. 29, 32, 33, and 34, the capacitorless memory device 1010 of FIG. 34 is different from all of the capacitorless memory devices 1000, 1006, and 1008 of FIGS. 29, 32, and 33. In other words, in the capacitorless memory device 1010 of FIG. 34, the second impurity layer 160 may not be directly and electrically connected to the ground line 240, only the third impurity layer 180 may be directly and electrically connected to the ground line 240, and the device isolation layer 220 in the capacitorless memory device 1000 of FIG. 29 may not be formed.

Figure 35:
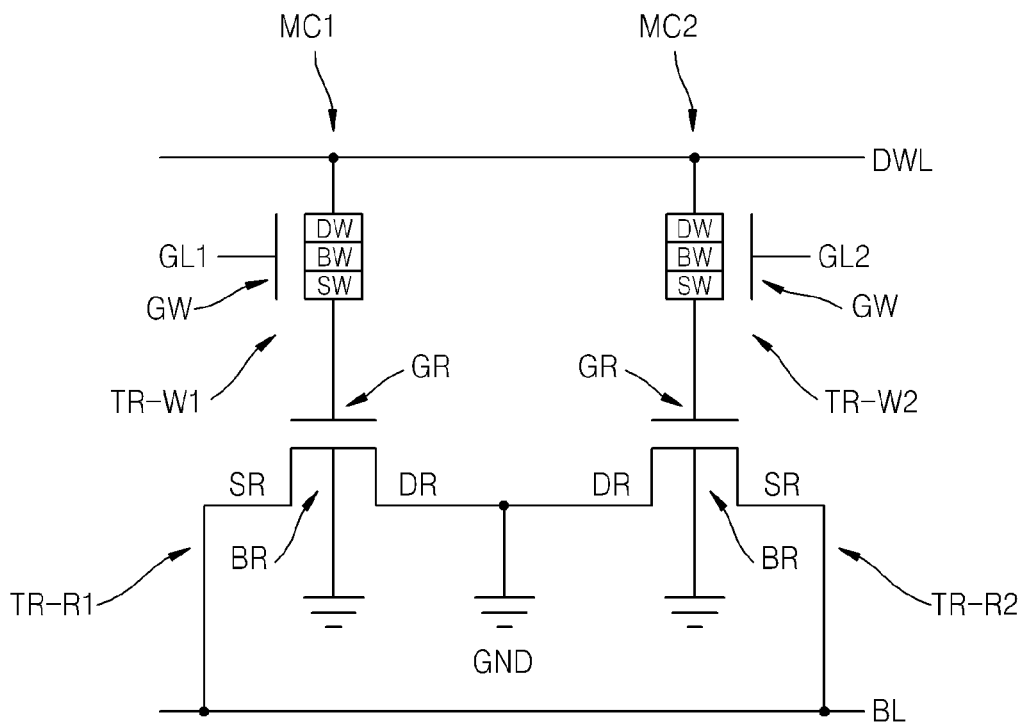
FIGS. 35 and 36 are equivalent circuit diagrams of capacitorless memory devices according to example embodiments of inventive concepts.

FIG. 35 is an equivalent circuit diagram of the capacitorless memory devices 1000, 1002, 1004, and 1008 of FIGS. 29, 30, 31, and 33, according an example embodiment of inventive concepts. Referring to FIG. 35 and FIGS. 29, 30, 31, and 33, each of the capacitorless memory devices 1000, 1002, 1004, and 1008 includes a first capacitorless memory cell MC1 and a second capacitorless memory cell MC2. The first and second capacitorless memory cells MC1 and MC2 include read transistors TR-R1 and TR-R2 and write transistors TR-W1 and TR-W2, respectively. In the read transistors TR-R1 and TR-R2, a drain DR may be connected to a ground GND and a source SR may be connected to a bit line BL. The ground GND and the bit line BL may correspond to the ground line 240 and the bit line 120, respectively.

In each of the read transistors TR-R1 and TR-R2, the drain DR may be connected to the ground GND and may correspond to the remained third impurity layer 184, and the source SR may be connected to the bit line BL and may correspond to the first impurity layer 140. One ground line 240 may be used as a common ground line GND that is connected to the drain DR of each of the two read transistors TR-R1 and TR-R2. A body BR of each of the read transistors TR-R1 and TR-R2 may be connected to the ground GND and may correspond to the extended second impurity layer 170. Thus, the drain DR and the body BR of each of the two read transistors TR-R1 and TR-R2 may be connected to one ground line 240.

A source SW of each of the write transistors TR-W1 and TR-W2 is electrically connected to a gate GR of each of the read transistors TR-R1 and TR-R2. The source layer 278 may correspond to both the source SW of each of the write transistors TR-W1 and TR-W2 and the gate GR of each of the read transistors TR-R1 and TR-R2. In other words, the source layer 278 may be integrally formed so that the source SW of each of the write transistors TR-W1 and TR-W2 and the gate GR of each of the read transistors TR-R1 and TR-R2 are electrically connected to each other.

In the write transistors TR-W1 and TR-W2, a body BW may correspond to the first body layer 320, the shutter layer 330, and the second body layer 340, and a drain DW may correspond to the drain layer 360. The drain DW of each of the write transistors TR-W 1 and TR-W2 may be electrically connected to a data word line DWL, and the data word line DWL may correspond to the data word line 700. A gate GW of each of the write transistors TR-W1 and TR-W2 may be electrically connected to gate lines GL1 and GL2 and may correspond to the gate line 420. Alternatively, the gate line 420 may correspond to the gate lines GL1 and GL2. Furthermore, in the write transistors TR-W1 and TR-W2, the gate GW may correspond to the side wall portion 404 and the gate column portion 268 of the gate line 420, and the gate lines GL1 and GL2 may correspond to the extension portion 406.

Each of the write transistors TR-W1 and TR-W2 may be a phase-state low electron-number drive transistor (PLEDTR). Each of the first and second capacitorless memory cells MC1 and MC2 may be a memory cell of a phase-state low electron-number drive memory (PLEDM).

Each of the read transistors TR-R1 and TR-R2 may be a transistor having a vertical structure in which the first impurity layer 140, the second impurity layer 170 and the remained third impurity layer 184 respectively corresponding to the source SR, the body BR, and the drain DR on the bit line 140 are sequentially stacked on the substrate 100 in a vertical direction, e.g., the third direction z.

Each of the write transistors TR-W1 and TR-W2 may be a transistor having a vertical structure in which the source layer 278, the body layer (320, 330, and 340), the drain layer 360 respectively corresponding to the source SW, the body BW, and the drain DW on the bit line 140 are sequentially stacked on the substrate 100 in a vertical direction, e.g., the third direction z. The gate line 420 of the write transistors TR-W1 and TR-W2 may be adjacent to the side surfaces of the body layer (320, 330, and 340) and may be separated and insulated from the side surfaces of the body layer (320, 330, and 340) by the side wall spacer insulation layer 382.

Since both of the read transistors TR-R1 and TR-R2 and the write transistors TR-W1 and TR-W2 are transistors having a vertical structure, a channel may also be formed in a vertical direction. When scaling is performed for high integration, the length of a channel of a transistor may not be reduced. Thus, generation of a short channel effect due to the high integration may be inhibited (and/or prevented).

The source 278 corresponding to the source SW of each of the write transistors TR-W1 and TR-W2 may correspond to the gate GR of each of the read transistors TR-R1 and TR-R2. The source layer 278 may be adjacent to the side surface of the second impurity layer 170 corresponding to the body BR of each of the read transistors TR-R1 and TR-R2, or may be separated and insulated from the side surface of the second impurity layer 170 by the second inner wall insulation layer 274.

The body BW of each of the write transistors TR-W1 and TR-W2 may be on/off by the gate line GL 1. Accordingly, the gate line 420 may completely overlap with the body layer (320, 330, and 340) in the third direction z. As a result, the upper surface of the gate line 420 with respect to the substrate 100, that is, the upper surface of the side wall portion 404, may be as high as or higher than the upper surface of the body layer (320, 330, and 340), that is, the upper surface of the second body layer 340. Also, the lower surface of the gate line 420 with respect to the substrate 100, that is, the lower surface of the gate column portion 268, may be as high as or lower than the lower surface of the body layer (320, 330, and 340), that is, the lower surface of the second body layer 340.

A threshold voltage of the read transistors TR-R1 and TR-R2 may be determined according to data stored in the source SW of each of the write transistors TR-W1 and TR-W2. The data may be read out by using the threshold voltage. Thus, the source layer 278 may completely overlap with a portion of the extended second impurity layer 170 that is adjacent to the source layer 278, that is, the second impurity layer 160 of FIG. 9, in the third direction z. Thus, the upper surface of the source layer 278 with respect to the substrate 100 may be as high as or higher than the upper surface of the second impurity layer 160, whereas the lower surface of the source layer 278 with respect to the substrate 100 may be as high as or lower than the lower surface of the second impurity layer 160.

The source layer 278 may completely overlap with the extended second impurity layer 170 or the remained third impurity layer 184 in the third direction z. Thus, the upper surface of the source layer 278 with respect to the substrate 100 may be higher than the upper surfaces of the extended second impurity layer 170 and the remained third impurity layer 184. For the same reason, the upper surface of the source layer 278 with respect to the substrate 100 may be higher than the upper surface of the remained third impurity layer 184.

In the capacitorless memory device 1008 of FIG. 33, to make common the source SR of each of the read transistor TR-R1 of the first capacitorless memory cell MC1 and the read transistor TR-R2 of the second capacitorless memory cell MC2, the first impurity layer 140 corresponding to the source SR of each of the read transistor TR-R1 of the first capacitorless memory cell MC1 and the read transistor TR-R2 of the second capacitorless memory cell MC2 may be integrally formed. Also, in the capacitorless memory device 1008 of FIG. 33, to make common the body BR of each of the read transistor TR-R1 of the first capacitorless memory cell MC1 and the read transistor TR-R2 of the second capacitorless memory cell MC2, the extended second impurity layer 170 corresponding to the body BR of each of the read transistor TR-R1 of the first capacitorless memory cell MC1 and the read transistor TR-R2 of the second capacitorless memory cell MC2 may be integrally formed.

Figure 36:
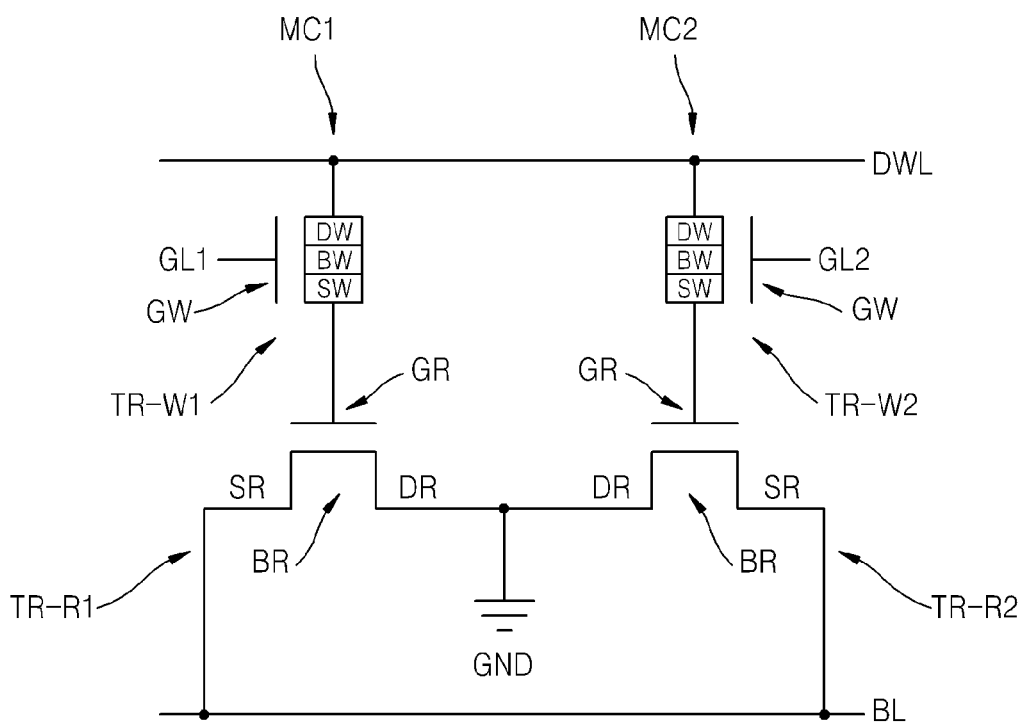

FIG. 36 is an equivalent circuit diagram of the capacitorless memory devices 1006 and 1010 of FIGS. 32 and 34, according to another example embodiment of inventive concepts. In the following description about FIG. 36, the same content as that described with reference to FIG. 35 is omitted herein.

Referring to FIG. 36 and FIGS. 32 and 34, each of the capacitorless memory devices 1006 and 1010 includes a first capacitorless memory cell MC1 and a second capacitorless memory cell MC2. The first and second capacitorless memory cells MC1 and MC2 include read transistors TR-R1 and TR-R2 and write transistors TR-W1 and TR-W2, respectively. In the read transistors TR-R1 and TR-R2, a drain DR may be connected to a ground GND and a source SR may be connected to a bit line BL. The ground GND and the bit line BL may correspond to the ground line 240 and the bit line 120, respectively.

In each of the read transistors TR-R1 and TR-R2, the drain DR may be connected to the ground GND and may correspond to the third impurity layer 180 and the source SR may be connected to the bit line BL and may correspond to the first impurity layer 140. One ground line 240 may be used as a common ground line GND connected to the two read transistors TR-R1 and TR-R2. The second impurity layer 160 corresponding to the body BR of each of the read transistors TR-R1 and TR-R2 may not be directly connected to the ground line 240. However, the second impurity layer 160 may be connected to the ground GND via another conductive line or resistive line. In other words, the structure corresponding to body BR may not be directly connected to the ground line 240.

Considering the descriptions with reference to FIGS. 1 through 34 and the descriptions about the capacitorless memory cells MC1 and MC2 with reference to FIGS. 35 and 36, forming of two transistors, that is, the read transistor TR-R1 or TR-R2 and the write transistor TR-W1 or TR-W2, forming one capacitorless memory cell MC1 or MC2 may need only an area of 4F×2F or 5F×2F, that is, 8F$^2$ or 10F$^2$.

Also, when the device isolation layer 220 is not included, the second trench 114 may not be formed and thus the third width W3 of the second trench 114 may be irrelevant. Furthermore, the third width W3 may be irrelevant in the fifth width W5 of the third trench 222 for forming the ground line 240. Thus, forming of two transistors, that is, the read transistor TR-R1 or TR-R2 and the write transistor TR-W1 or TR-W2, forming one capacitorless memory cell MC1 or MC2 may need only an area of 3F×2F or 4F×2F, that is, 6F$^2$ or 8F$^2$.

Thus, compared to a DRAM having one transistor and one capacitor (1T-1C), the capacitorless memory devices 1000, 1002, 1004, 1006, 1008, and 1010 according to inventive concepts need only an area that is the same as or almost similar to that of the DRAM. Since it is essential for the DRAM to secure a capacity of a capacitor, there is a limit to reducing the minimum feature size F. In contrast, the capacitorless memory devices 1000, 1002, 1004, 1006, 1008, and 1010 according to inventive concepts have no limit so that integration may be more easily improved through the reduction of the minimum feature size F.

As described above, a capacitorless memory device according to inventive concepts in which two transistors form one capacitorless memory cell may overcome the integration limit due to a need for securing the capacity of a capacitor. Also, since the capacitorless memory device has a vertical type read transistor and a vertical type write transistor, a channel length may not be reduced in spite of high integration so that a short channel effect due to the high integration may be inhibited (and/or prevented).

While some example embodiments of inventive concepts have been particularly shown and described with reference, it will be understood that various changes in form and details may be made therein without departing from the spirit and scope of the following claims.

What is claimed is:

1. A capacitorless memory device comprising: at least one capacitorless memory cell, each capacitorless memory cell including,
    a bit line on a substrate;
    a read transistor including,
        a first impurity layer, a second impurity layer, and a third impurity layer stacked in a vertical direction on the bit line,
        the first and third impurity layers being a first conductive type, and
        the second impurity layer being a second conductive type that is different from the first conductive type;
    a write transistor including,
        a source layer, a body layer, and a drain layer stacked in the vertical direction on the substrate,
        the source layer being adjacent to a side surface of the second impurity layer of the read transistor, and
        a gate line adjacent to a side surface of the body layer, the gate line being spaced apart from the side surface of the body layer; and
    a ground line that is electrically connected to the third impurity layer.

2. The capacitorless memory device of claim 1, wherein the write transistor further includes:
    a source barrier layer between the source layer and the body layer, and
    a drain barrier layer between the drain layer and the body layer.

3. The capacitorless memory device of claim 1, wherein the body layer includes:
    a first body layer,
    a second body layer over the first body layer, and
    a shutter layer between the first and second body layers.

4. The capacitorless memory device of claim 1, wherein
    the source layer and the drain layer include metal, and
    the source layer and the body layer form a first Schottky contact, and
    the drain layer and the body layer form a second Schottky contact.

5. The capacitorless memory device of claim 1, wherein
    an upper surface of the gate line is as high as or higher than an upper surface of the body layer, and
    a lower surface of the gate line is as high as or lower than a lower surface of the body layer.

6. The capacitorless memory device of claim 5, wherein the lower surface of the gate line and a lower surface of the source layer are at equal heights.

7. The capacitorless memory device of claim 1, wherein a lower surface of the source layer is as low as or lower than a lower surface of the second impurity layer.

8. The capacitorless memory device of claim 7, wherein an upper surface of the source layer is higher than upper surfaces of the second impurity layer and the third impurity layer.

9. The capacitorless memory device of claim 1, wherein the gate line surrounds the side surface of the body layer.

10. The capacitorless memory device of claim 9, wherein the gate line surrounds the side surface of the drain layer.

11. The capacitorless memory device of claim 1, further comprising:
a fourth impurity layer electrically connected to the ground line, wherein
the fourth impurity layer is the second conductive type, and
the fourth impurity layer is adjacent to the second impurity layer.

12. The capacitorless memory device of claim 1, wherein
the bit line extends in a first direction,
the gate line and the ground line extend in a second direction, and
the second direction is different than the first direction.

13. The capacitorless memory device of claim 1, wherein the first impurity layer is between the gate line and the bit line in the vertical direction.

14. A capacitorless memory device comprising:
a bit line on a substrate;
first and second capacitorless memory cells, the first and second capacitorless memory cells each including,
a read transistor including,
a first impurity layer, a second impurity layer, and a third impurity layer stacked in a vertical direction on the bit line,
the first and third impurity layers being a first conductive type,
the second impurity layer being a second conductive type that is different from the first conductive type, and
a write transistor including,
a source layer, a body layer, and a drain layer stacked in the vertical direction on the substrate,
the source layer being adjacent to a side surface of the second impurity layer of the read transistor, and
a gate line that is adjacent to a side surface of the body layer and spaced apart from the side surface of the body layer,
wherein the first impurity layer is between the gate line and the bit line in the vertical direction.

15. The capacitorless memory device of claim 14, wherein the second impurity layer of the first capacitorless memory cell and the second impurity layer of the second capacitorless memory cell are integrally formed.

16. A capacitorless memory device comprising:
a bit line;
a ground line;
a data word line; and
at least one capacitorless memory cell including,
a read transistor on the bit line, the read transistor including,
a source structure electrically connected to the bit line,
a drain structure electrically connected to the ground line,
a body structure between the source and drain structures, and
a write transistor including,
a vertical stack including a source layer, a body layer, and a drain layer,
the drain layer being connected to the data word line, and
the source layer being configured to function as a gate electrode for the read transistor, and
a gate adjacent to the vertical stack.

17. The capacitorless memory device of claim 16, further comprising:
a first interwall insulation layer between the source layer of the write transistor and at least one of the source structure, body structure, and drain structure of the read transistor; and
a substrate, wherein
the source structure, body structure, and drain structure of the read transistor are sequentially stacked on the substrate, and
the ground line is electrically connected to the body structure of the read transistor.

18. The capacitorless memory device of claim 17, wherein
the body layer and the drain layer of the write transistor are surrounded by the gate of the write transistor,
the source structure and the drain structure of the read transistor are a first conductive type,
the body structure is a second conductive type, and
the second conductive type is different than the first conductive type.

19. The capacitorless memory device of claim 16,
a first interwall insulation layer between the source layer of the write transistor and at least one of the source structure, body structure, and drain structure of the read transistor; and
a substrate, wherein
the source structure, body structure, and drain structure of the read transistor are sequentially stacked on the substrate,
the ground line is not directly connected to the body structure of the read transistor.

20. The capacitorless memory device of claim 16, further comprising:
a device isolation layer between the ground line and the bit line, wherein
the read transistor is a vertical-type transistor structure,
the source structure and the drain structure of the read transistor are a first conductive type,
the body structure is a second conductive type, and
the second conductive type is different than the first conductive type.

* * * * *

UNITED STATES PATENT AND TRADEMARK OFFICE
CERTIFICATE OF CORRECTION

PATENT NO.           : 8,941,173 B2                                        Page 1 of 1
APPLICATION NO.      : 13/775586
DATED                : January 27, 2015
INVENTOR(S)          : Seung-uk Han et al.

It is certified that error appears in the above-identified patent and that said Letters Patent is hereby corrected as shown below:

On the title page, please add item (30)

The missing Foreign Application Priority Data should read as:

March 22, 2012    (KR) ............................... 10-2012-0029414

Signed and Sealed this
Twenty-eighth Day of June, 2016

Michelle K. Lee
*Director of the United States Patent and Trademark Office*